(12) United States Patent
Fujiwara et al.

(10) Patent No.: US 8,791,464 B2
(45) Date of Patent: Jul. 29, 2014

(54) NONVOLATILE SEMICONDUCTOR MEMORY DEVICE AND METHOD FOR MANUFACTURING SAME

(75) Inventors: Tomoko Fujiwara, Kanagawa-ken (JP); Ryota Katsumata, Mie-ken (JP); Masaru Kito, Kanagawa-ken (JP); Yoshiaki Fukuzumi, Kanagawa-ken (JP); Masaru Kidoh, Mie-ken (JP); Hiroyasu Tanaka, Mie-ken (JP); Yosuke Komori, Mie-ken (JP); Megumi Ishiduki, Mie-ken (JP); Hideaki Aochi, Kanagawa-ken (JP); Ryouhei Kirisawa, Kanagawa-ken (JP); Yoshimasa Mikajiri, Mie-ken (JP); Shigeto Oota, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 739 days.

(21) Appl. No.: 12/820,371

(22) Filed: Jun. 22, 2010

(65) Prior Publication Data
US 2011/0018052 A1 Jan. 27, 2011

(30) Foreign Application Priority Data
Jul. 21, 2009 (JP) .................................. 2009-170455

(51) Int. Cl.
*H01L 29/792* (2006.01)

(52) U.S. Cl.
USPC ....................... 257/74; 257/324; 257/E27.026

(58) Field of Classification Search
CPC ...................... H01L 27/11578; H01L 27/1158; H01L 27/11582
USPC ............ 257/638, 74, 278, E27.026, E21.614, 257/324, E27.103, E29.309
See application file for complete search history.

(56) References Cited

U.S. PATENT DOCUMENTS 8,247,863 B2 * 8/2012 Fukuzumi et al. ............ 257/324
2007/0252201 A1 11/2007 Kito et al.
(Continued)

FOREIGN PATENT DOCUMENTS

JP 6-112190 4/1994
JP 2001-53250 2/2001
(Continued)

OTHER PUBLICATIONS

U.S. Appl. No. 12/679,991, filed Mar. 25, 2010, Yoshiaki Fukuzumi, et al.
(Continued)

*Primary Examiner* — Stephen W Smoot
*Assistant Examiner* — Sun M Kim
(74) *Attorney, Agent, or Firm* — Oblon, Spivak, McClelland, Maier & Neustadt, L.L.P.

(57) ABSTRACT

According to one embodiment, a nonvolatile semiconductor memory device includes a stacked structure, a semiconductor pillar, a memory layer and an outer insulating film. The stacked structure includes a plurality of electrode films and a plurality of interelectrode insulating films alternately stacked in a first direction. The semiconductor pillar pierces the stacked structure in the first direction. The memory layer is provided between the electrode films and the semiconductor pillar. The outer insulating film is provided between the electrode films and the memory layer. The device includes a first region and a second region. An outer diameter of the outer insulating film along a second direction perpendicular to the first direction in the first region is larger than that in the second region. A thickness of the outer insulating film along the second direction in the first region is thicker than that in the second region.

17 Claims, 12 Drawing Sheets

(56) References Cited

U.S. PATENT DOCUMENTS

| | | | |
|---|---|---|---|
| 2008/0315291 A1* | 12/2008 | Kito et al. | 257/324 |
| 2009/0294828 A1* | 12/2009 | Ozawa et al. | 257/319 |
| 2010/0237402 A1* | 9/2010 | Sekine et al. | 257/324 |

FOREIGN PATENT DOCUMENTS

| | | | |
|---|---|---|---|
| JP | 2004-56142 | | 2/2004 |
| JP | 2007-266143 | | 10/2007 |
| JP | 2007-317874 | * | 12/2007 |
| JP | 2009-158529 | | 7/2009 |
| WO | WO 2009/075370 A1 | | 6/2009 |
| WO | WO 2009/084206 | * | 7/2009 |

OTHER PUBLICATIONS

Japanese Office Action issued Jun. 17, 2013, in Japan Patent Application No. 2009-170455 (with English translation).

* cited by examiner

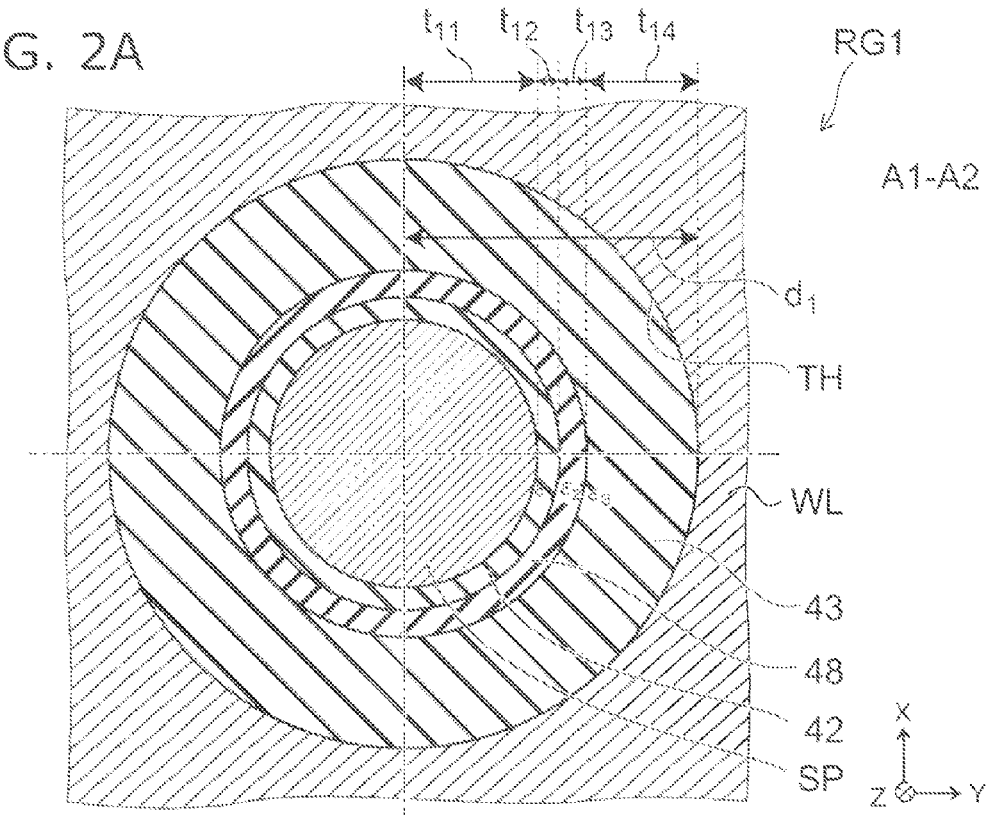
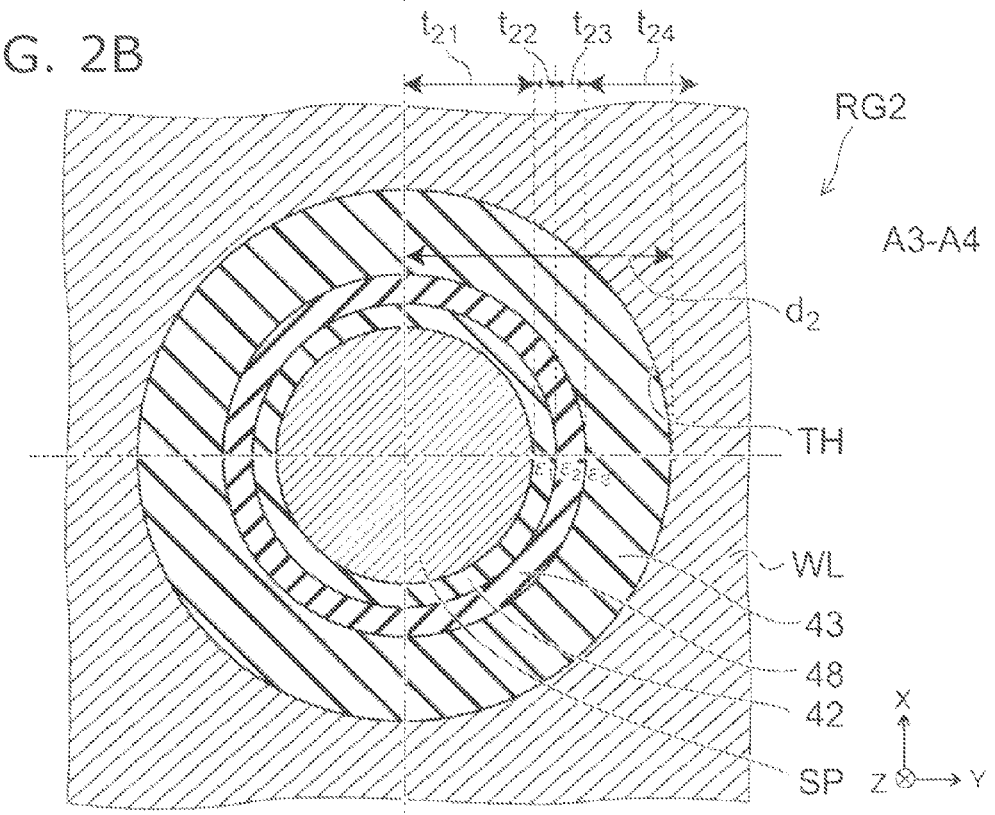

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2009-170455, filed on Jul. 21, 2009; the entire contents of which are incorporated herein by reference.

FIELD

Embodiments described herein relate generally to a nonvolatile semiconductor memory device and a method for manufacturing the same.

BACKGROUND

A collectively processed three-dimensional stacked memory has been proposed to increase the memory capacity of a nonvolatile semiconductor memory device (see, e.g., JP-A-2007-266143). In this memory, a stacked memory can be collectively formed irrespective of the number of stacked layers, and hence the increase of cost can be suppressed.

In this collectively processed three-dimensional stacked memory, insulating films are alternately stacked with electrode films serving as word lines to form a stacked structure, in which through holes are collectively formed. Then, a charge storage layer (memory layer) is provided on the side surface of the through hole, and a semiconductor pillar is provided inside the charge storage layer. A tunnel insulating film is provided between the charge storage layer and the semiconductor pillar, and a block insulating film is provided between the charge storage layer and the electrode film. Thus, a memory cell illustratively made of a MONOS (metal oxide nitride oxide semiconductor) transistor is formed at the intersection between each electrode film and the semiconductor pillar.

BRIEF DESCRIPTION OF THE DRAWINGS

FIGS. 2A and 2B are schematic cross-sectional views illustrating the configuration of the nonvolatile semiconductor memory device according to the first embodiment;

DETAILED DESCRIPTION

Figure 1:
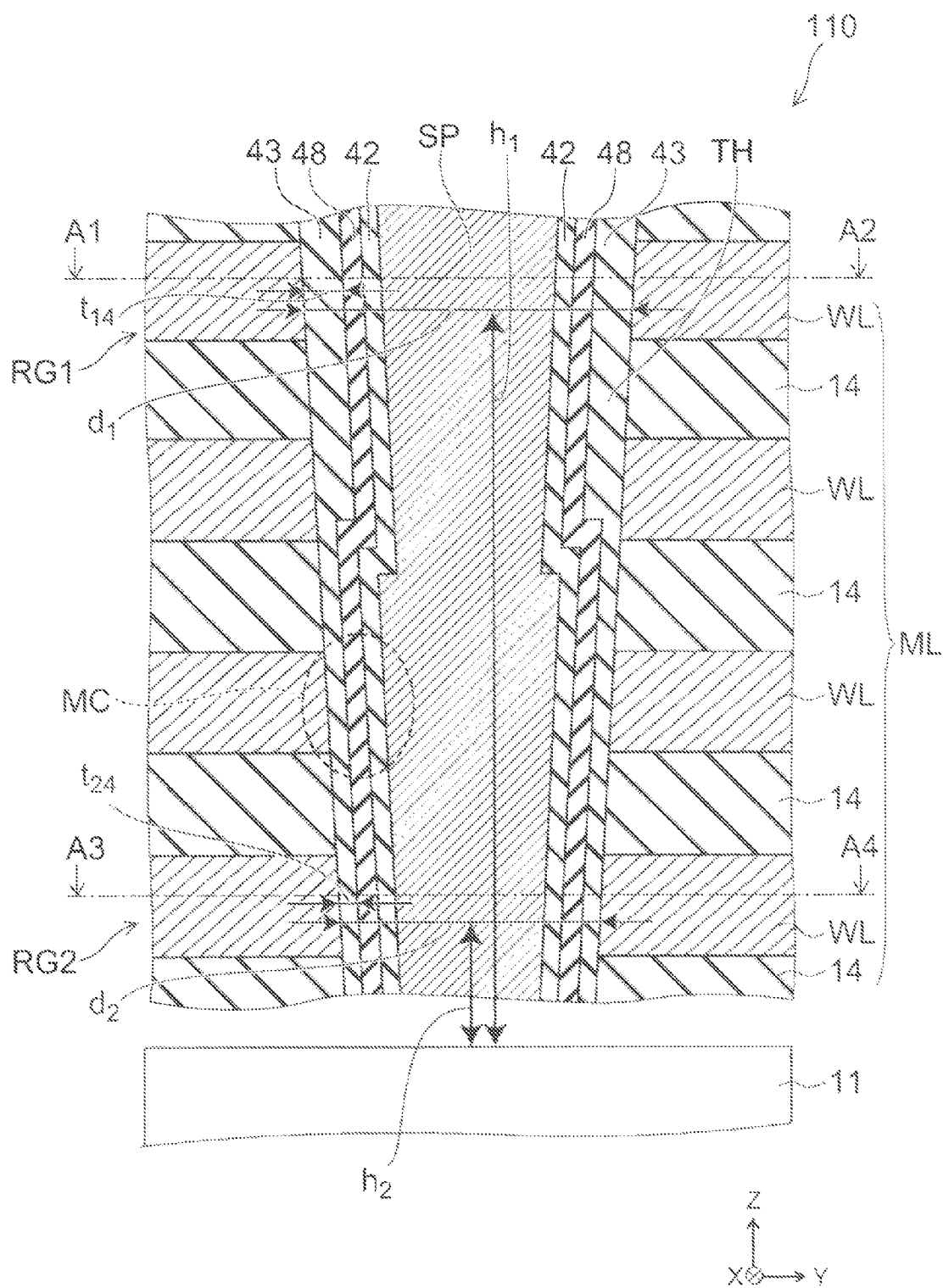
FIG. 1 is a schematic cross-sectional view illustrating the configuration of a nonvolatile semiconductor memory device according to a first embodiment.

In general, according to one embodiment, a nonvolatile semiconductor memory device includes a stacked structure, a semiconductor pillar, a memory layer, an inner insulating film and an outer insulating film. The stacked structure includes a plurality of electrode films and a plurality of interelectrode insulating films alternately stacked in a first direction. The semiconductor pillar pierces the stacked structure in the first direction. The memory layer is provided between each of the electrode films and the semiconductor pillar. The inner insulating film is provided between the memory layer and the semiconductor pillar. The outer insulating film is provided between each of the electrode films and the memory layer. The device includes a first region and a second region. An outer diameter of the outer insulating film along a second direction perpendicular to the first direction in the first region is larger than an outer diameter of the outer insulating film along the second direction in the second region. A thickness of the outer insulating film along the second direction in the first region is thicker than a thickness of the outer insulating film along the second direction in the second region.

According to another embodiment, a method for manufacturing a nonvolatile semiconductor memory device is provided. The device includes a stacked structure, a semiconductor pillar, a memory layer, an inner insulating film and an outer insulating film. The stacked structure includes a plurality of electrode films and a plurality of interelectrode insulating films alternately stacked in a first direction. The semiconductor pillar pierces the stacked structure in the first direction. The memory layer is provided between each of the electrode films and the semiconductor pillar. The inner insulating film is provided between the memory layer and the semiconductor pillar. The outer insulating film is provided between each of the electrode films and the memory layer. The device includes a first region and a second region. An outer diameter of the outer insulating film along a second direction perpendicular to the first direction in the first region is larger than an outer diameter of the outer insulating film along the second direction in the second region. A thickness of the outer insulating film along the second direction in the first region is thicker than a thickness of the outer insulating film along the second direction in the second region. The method includes: forming the stacked structure on a substrate; forming a through hole piercing the stacked structure in the first direction; forming a silicon layer on an inner wall surface of the through hole; forming a sacrificial layer in remaining space of the through hole; forming a portion of the outer insulating film by recessing the sacrificial layer to a depth halfway through the through hole and oxidizing the silicon layer exposed from the sacrificial layer; removing the sacrificial layer; forming the outer insulating film by forming another portion of the outer insulating film in remaining space of the through hole; forming the memory layer and the inner insulating film in remaining space of the through hole; and forming the semiconductor pillar by burying a semiconductor in remaining space of the through hole.

Embodiments of the invention will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, the same elements as those described previously with reference to earlier figures are labeled with like reference numerals, and the detailed description thereof is omitted as appropriate.

First Embodiment

FIG. 1 is a schematic cross-sectional view illustrating the configuration of a nonvolatile semiconductor memory device according to a first embodiment.

FIGS. 2A and 2B are schematic cross-sectional views illustrating the configuration of the nonvolatile semiconductor memory device according to the first embodiment.

More specifically, FIGS. 2A and 2B are the A1-A2 cross-sectional view and A13-A4 cross-sectional view, respectively, of FIG. 1.

Figure 3:
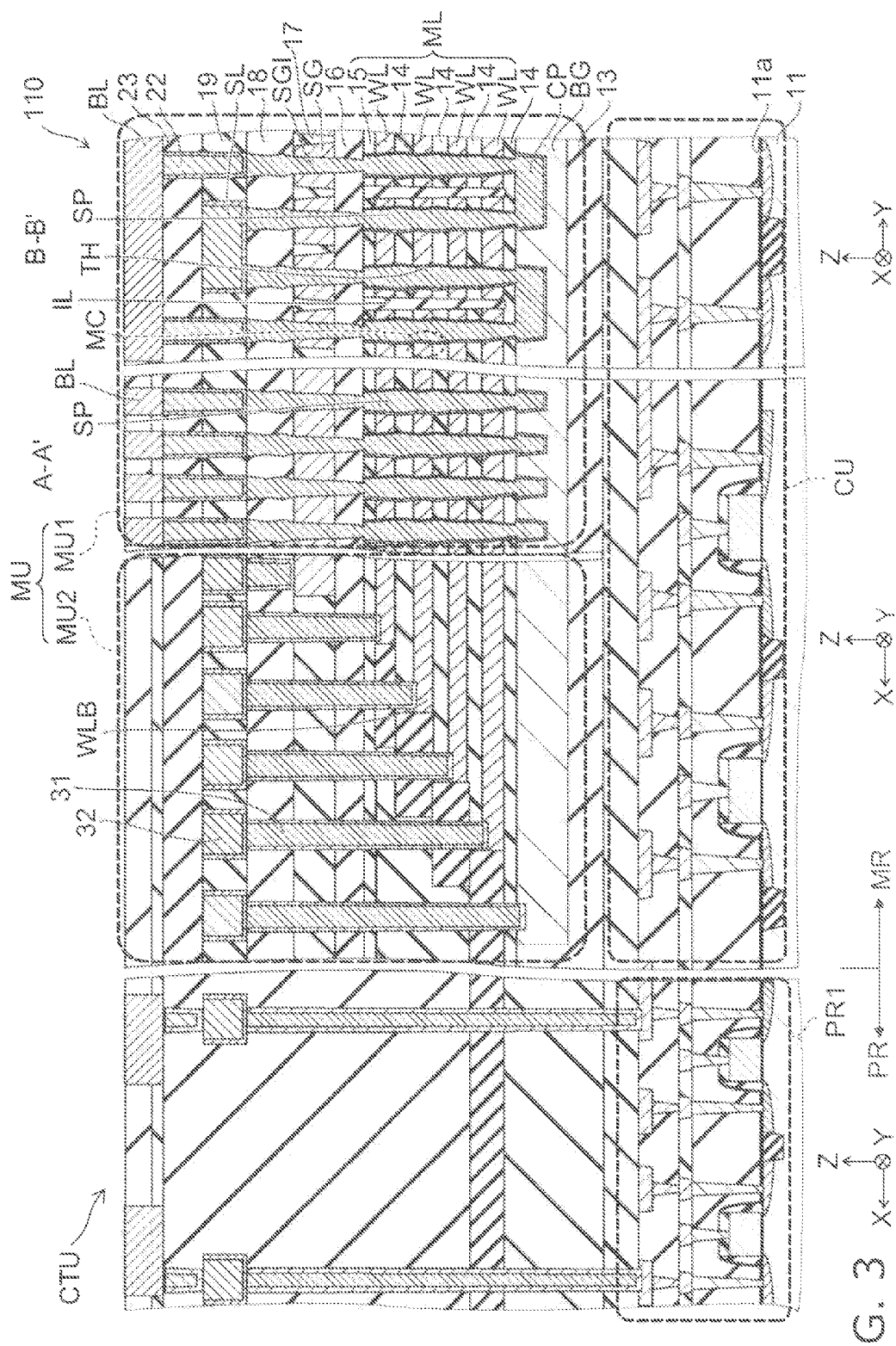
FIG. 3 is a schematic cross-sectional view illustrating the configuration of the nonvolatile semiconductor memory device according to the first embodiment.
Figure 4:
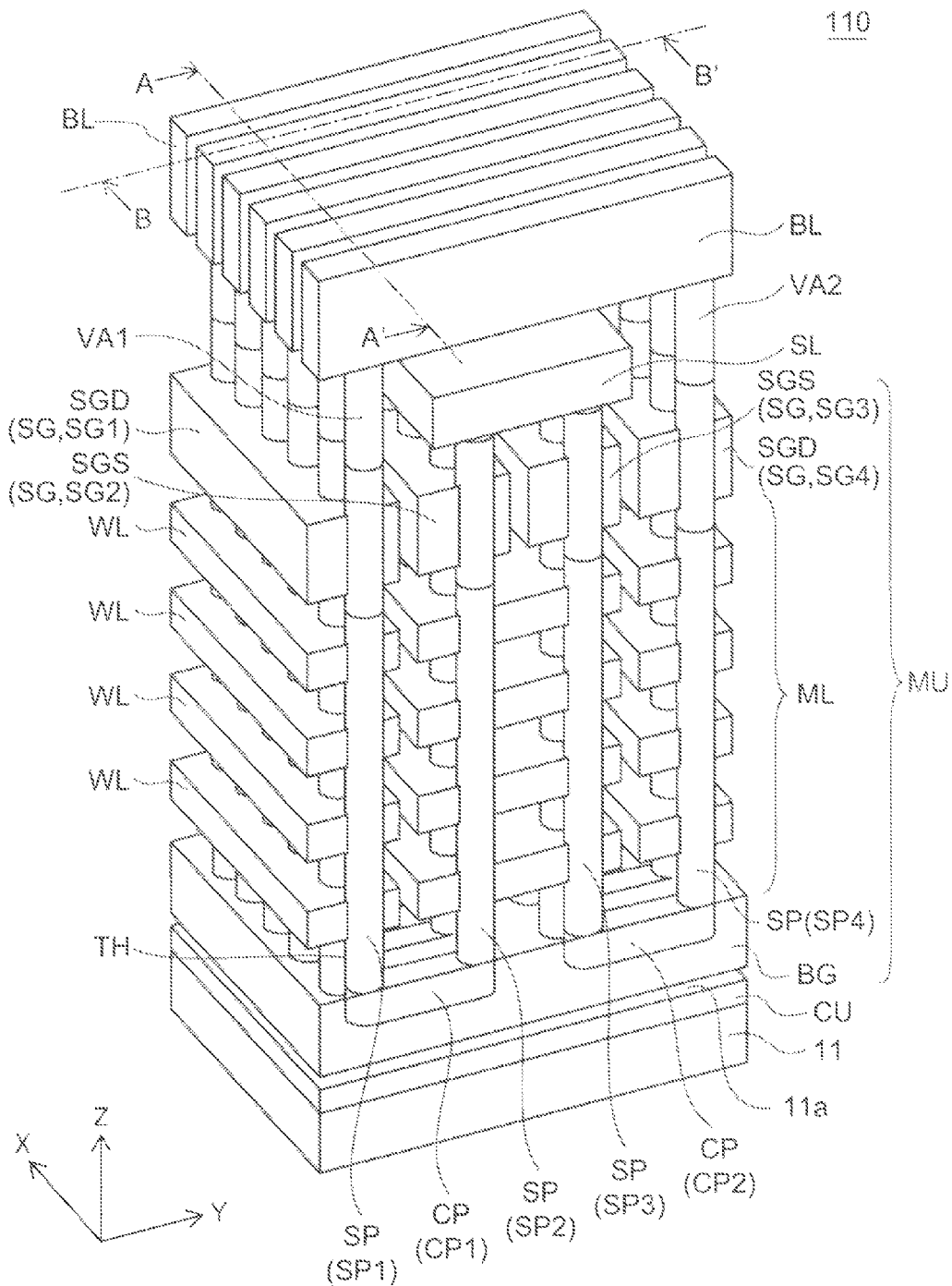
FIG. 4 is a schematic perspective view illustrating the configuration of the nonvolatile semiconductor memory device according to the first embodiment.

FIGS. 3 and 4 are a schematic cross-sectional view and a schematic perspective view, respectively, illustrating the configuration of the nonvolatile semiconductor memory device according to the first embodiment.

It is noted that for clarity of illustration, FIG. 4 shows only the conductive portions, and omits the insulating portions.

The nonvolatile semiconductor memory device 110 according to this embodiment is a collectively processed three-dimensional stacked flash memory.

First, the configuration of the nonvolatile semiconductor memory device 110 is outlined with reference to FIGS. 3 and 4.

As shown in FIG. 3, the nonvolatile semiconductor memory device 110 illustratively includes a memory unit MU and a control unit CTU. The memory unit MU and the control unit CTU are provided on the major surface 11a of a substrate 11 illustratively made of single crystal silicon.

On the substrate 11, for instance, a memory array region MR to be provided with memory cells and a peripheral region PR illustratively provided around the memory array region MR are defined. In the peripheral region PR, various peripheral region circuits PR1 are provided on the substrate 11.

In the memory array region MR, a circuit unit CU is illustratively provided on the substrate 11, and the memory unit MU is provided on the circuit unit CU. It is noted that the circuit unit CU is provided as needed, and can be omitted. An interlayer insulating film 13 illustratively made of silicon oxide film is provided between the circuit unit CU and the memory unit MU.

At least part of the control unit CTU, for instance, can illustratively be provided in at least one of the peripheral region circuit PR1 and the circuit unit CU described above.

The memory unit MU includes a matrix memory cell unit MU1 including a plurality of memory cell transistors, and a interconnection connecting unit MU2 for connecting interconnections in the matrix memory cell unit MU1.

FIG. 4 illustrates the configuration of the matrix memory cell unit MU1.

More specifically, with regard to the matrix memory cell unit MU1, FIG. 3 illustrates part of the A-A' cross section of FIG. 4 and part of the B-B' cross section of FIG. 4.

As shown in FIGS. 3 and 4, in the matrix memory cell unit MU1, a stacked structure ML is provided on the major surface 11a of the substrate 11. The stacked structure ML includes a plurality of electrode films WL and a plurality of interelectrode insulating films 14 alternately stacked in the direction perpendicular to the major surface 11a.

Here, the direction perpendicular to the major surface 11a of the substrate 11 is referred to as Z-axis direction (first direction). Furthermore, one of the directions in the plane parallel to the major surface 11a is referred to as Y-axis direction (second direction). Furthermore, the direction perpendicular to the Z axis and the Y axis is referred to as X-axis direction (third direction).

The stacking direction of the electrode films WL and the interelectrode insulating films 14 in the stacked structure ML is the Z-axis direction. The electrode film WL is illustratively divided for each erase block. It is noted that the number of electrode films WL and interelectrode insulating films 14 provided in the stacked structure ML is arbitrary.

FIG. 1 illustrates the configuration of the matrix memory cell unit MU1, illustratively corresponding to part of the B-B' cross section of FIG. 4.

As shown in FIG. 1, the memory unit MU of the nonvolatile semiconductor memory device 110 includes the aforementioned stacked structure ML, a first semiconductor pillar SP1 (semiconductor pillar SP) piercing the stacked structure ML in the Z-axis direction, a memory layer 48, an inner insulating film 42, and an outer insulating film 43.

The memory layer 48 is provided between each electrode film WL and the semiconductor pillar SP. The inner insulating film 42 is provided between the memory layer 48 and the semiconductor pillar SP. The outer insulating film 43 is provided between each electrode film WL and the memory layer 48.

The inner insulating film 42, the memory layer 48, and the outer insulating film 43 are each shaped like a tube (pipe). The inner insulating film 42, the memory layer 48, and the outer insulating film 43 are illustratively shaped like concentric cylinders whose central axis is the central axis of the semiconductor pillar SP extending in the Z-axis direction, and are arranged in the order of the inner insulating film 42, the memory layer 48, and the outer insulating film 43 from the inside to the outside.

For instance, the outer insulating film 43, the memory layer 48, and the inner insulating film 42 are formed in this order on the inner wall surface of the through hole TH piercing the stacked structure ML in the Z-axis direction, and the remaining space is filled with a semiconductor to form the semiconductor pillar SP.

The shape of the through hole TH cut along the X-Y plane is illustratively circular, and in this case, the inner and outer shape of the inner insulating film 42, the memory layer 48, and the outer insulating film 43 cut along the X-Y plane are each circular. In this specification, the "circular" shape includes not only the shape of a perfect circle, but also shapes of ellipses, flat circles and the like.

Furthermore, the inner and outer shape of the inner insulating film 42, the memory layer 48, and the outer insulating film 43 cut along the X-Y plane are arbitrary. For instance, they may be polygons with the vertex portions rounded. In the following description, it is assumed that the inner and outer shape of the inner insulating film 42, the memory layer 48, and the outer insulating film 43 cut along the X-Y plane are circular. In this case, the outer shape of the semiconductor pillar SP cut along the X-Y plane is circular.

In this example, the semiconductor pillar SP is columnar, including no voids or other members inside. However, the semiconductor pillar SP may be shaped like a tube extending in the Z-axis direction. In the case where the semiconductor pillar SP is tubular, a core member made of insulator may be provided inside the tubular shape, or the inside of the tubular shape may be empty. For instance, when the outer insulating film 43, the memory layer 48, the inner insulating film 42, and the semiconductor pillar SP are formed in this order on the inner wall surface of the through hole TH, a seam portion may exist at the center of the semiconductor pillar SP. In the following description, it is assumed that the semiconductor pillar SP is columnar.

A memory cell MC is provided at the intersection between the electrode film WL of the stacked structure ML and the semiconductor pillar SP. That is, memory cell transistors including the memory layer 48 are provided in a three-dimensional matrix, each at the intersection between the electrode film WL and the semiconductor pillar SP. Each memory cell transistor functions as a memory cell MC for storing data by storing charge in the memory layer 48.

The inner insulating film 42 functions as a tunnel insulating film in the memory cell transistor of the memory cell MC. On the other hand, the outer insulating film 43 functions as a block insulating film in the memory cell transistor of the memory cell MC. The interelectrode insulating film 14 functions as an interlayer insulating film for insulating the electrode films WL from each other.

The electrode film WL can be made of any conductive material, such as amorphous silicon or polysilicon provided with conductivity by impurity doping, or can be made of metals and alloys. A prescribed electrical signal is applied to the electrode film WL, which functions as a word line of the nonvolatile semiconductor memory device 110.

The interelectrode insulating film 14, the inner insulating film 42, and the outer insulating film 43 can illustratively be silicon oxide films. It is noted that the interelectrode insulating film 14, the inner insulating film 42, and the outer insulating film 43 may be a monolayer film or a stacked film.

The memory layer 48 can illustratively be a silicon nitride film. That is, the memory layer 48 can include silicon nitride. The memory layer 48 functions as a portion for storing information by storing or releasing charge by an electric field applied between the semiconductor pillar SP and the electrode film WL. The memory layer 48 may be a monolayer film or a stacked film.

As described later, the interelectrode insulating film 14, the inner insulating film 42, the memory layer 48, and the outer insulating film 43 can be made of various materials, not limited to the materials illustrated above.

As shown in FIG. 1, the nonvolatile semiconductor memory device 110 thus configured includes portions with the diameter of the through hole TH being large and small. For instance, when the through hole TH is formed in the stacked structure ML, a tapered through hole TH is formed. That is, the diameter of the through hole TH is large in the portion (upper portion) with a long distance from the substrate 11, and small in the portion (lower portion) with a short distance from the substrate 11. It is noted that in FIG. 1, the difference in the diameter of the through hole TH is emphasized. However, for instance, the angle between the wall surface of the through hole TH and the major surface 11a is e.g. 89.2 degrees or less. That is, the angle between the wall surface of the through hole TH (the outer wall surface of the outer insulating film 43) and the Z-axis direction is e.g. 0.8 degree or more.

The application of the configuration of this embodiment to the nonvolatile semiconductor memory device causes the angle (average angle) between the wall surface of the semiconductor pillar SP and the Z-axis direction to be smaller than the angle (average angle) between the wall surface of the through hole TH (the outer wall surface of the outer insulating film 43) and the Z-axis direction.

For example, in the case where the angle (average angle) between the wall surface of the through hole TH (the outer wall surface of the outer insulating film 43) and the Z-axis direction is 0.8 degree or more, the angle (average angle) the wall surface of the semiconductor pillar SP and the Z-axis direction can be taken to be 0.8 degree or less.

When the diameter of the through hole TH is thus different between the upper side and the lower side, if the thickness of each insulating film formed inside the through hole TH is constant, the electric field applied to each insulating film becomes nonuniform between the upper side and the lower side due to difference in the curvature of the through hole TH. However, in the nonvolatile semiconductor memory device 110 according to this embodiment, the thickness of the insulating film formed inside the through hole TH is adjusted so as to compensate for this nonuniformity in the electric field.

Specifically, the thickness of the outer insulating film 43 is designed to be thicker in the portion with the diameter of the through hole TH being large than in the portion with the diameter being small.

More specifically, in the first region RG1 with the outer diameter of the outer insulating film 43 along the Y-axis direction perpendicular to the Z-axis direction being large, the thickness of the outer insulating film 43 in the Y-axis direction is thicker than in the second region RG2 with the outer diameter being smaller than in the first region RG1.

As shown in FIGS. 1 and 2, the first outer diameter d1 of the outer insulating film 43 along the Y-axis direction in the first region RG1 is larger than the second outer diameter d2 of the outer insulating film 43 along the Y-axis direction in the second region RG2.

Here, the first outer diameter d1 is the length in the first region RG1 from one end in the Y-axis direction of the boundary between the outer insulating film 43 and the electrode film WL to the other end in the Y-axis direction. The second outer diameter d2 is the length in the second region RG2 from one end in the Y-axis direction of the boundary between the outer insulating film 43 and the electrode film WL to the other end in the Y-axis direction.

Furthermore, in this example, the first region RG1 is located farther from the substrate 11 than the second region RG2 as viewed in the Z-axis direction.

However, the embodiment of the invention is not limited thereto as long as the thickness of the outer insulating film 43 is thicker in the region with the outer diameter of the outer insulating film 43 being large than in the region with the outer diameter being small. For instance, the outer diameter may be large in the region near the substrate and in the region with a middle distance from the substrate, and the thickness of the outer insulating film 43 may be thicker therein.

In the following description, it is assumed that the first region RG1 is located farther from the substrate 11 than the second region RG2 as viewed in the Z-axis direction.

That is, the thickness of the outer insulating film 43 along the Y-axis direction in the first region RG1 located at a long distance h1 from the substrate 11 as viewed in the Z-axis direction is thicker than the thickness of the outer insulating film 43 along the Y-axis direction in the second region RG2 located at a shorter distance h2 than the first region RG1 as viewed in the Z-axis direction.

In the following, the first region RG1 is referred to as "upper" portion as appropriate, and the second region RG2 is referred to as "lower" portion as appropriate.

By this configuration, as described later, the electric field at the surface of the inner insulating film 42 on the semiconductor pillar SP side in the first region RG1 can be equalized to the electric field at the surface of the inner insulating film 42 on the semiconductor pillar SP side in the second region RG2.

That is, the nonvolatile semiconductor memory device 110 includes a first region RG1 and a second region RG2 where the electric field at the surface of the inner insulating film 42 on the semiconductor pillar SP side can be equalized to each other despite the difference therebetween in the diameter of the through hole TH (the outer diameter of the outer insulating film 43). In other words, such regions where the electric field at the surface of the inner insulating film 42 on the semiconductor pillar SP side is equal to each other while the diameter of the through hole TH (the outer diameter of the outer insulating film 43) is different from each other, are defined as a first region RG1 and a second region RG2.

The electric field at the surface of the inner insulating film 42 on the semiconductor pillar SP side is described.

As shown in FIG. 2A, the thickness of each layer in the first region RG1 is referred to as follows.

The distance along the Y-axis direction from the center of the semiconductor pillar SP in the Y-axis direction to the boundary between the semiconductor pillar SP and the inner insulating film 42 is referred to as a first semiconductor pillar thickness $t_{11}$. The thickness of the inner insulating film 42 along the Y-axis direction is referred to as a first inner insulating film thickness $t_{12}$, the thickness of the memory layer 48 along the Y-axis direction is referred to as a first memory layer thickness $t_{13}$, and the thickness of the outer insulating film 43 along the Y-axis direction is referred to as a first outer insulating film thickness $t_{14}$.

On the other hand, as shown in FIG. 2B, the thickness of each layer in the second region RG2 is referred to as follows. The distance along the Y-axis direction from the center of the semiconductor pillar SP in the Y-axis direction to the boundary between the semiconductor pillar SP and the inner insulating film 42 is referred to as a second semiconductor pillar thickness $t_{21}$. The thickness of the inner insulating film 42 along the Y-axis direction is referred to as a second inner insulating film thickness $t_{22}$, the thickness of the memory layer 48 along the Y-axis direction is referred to as a second memory layer thickness $t_{23}$, and the thickness of the outer insulating film 43 along the Y-axis direction is referred to as a second outer insulating film thickness $t_{24}$.

The relative permittivity of the inner insulating film 42 is denoted by $\varepsilon_1$, the relative permittivity of the memory layer 48 is denoted by $\varepsilon_2$, and the relative permittivity of the outer insulating film 43 is denoted by $\varepsilon_3$.

First, the electric field in a capacitor shaped like concentric cylinders is described. A cylindrical conductor with radius $t_a$ and length L, and a cylindrical conductor with radius $t_b$, larger than the radius $t_a$, and length L are arranged so that the axial centers coincide. When positive and negative charge Q are placed on the cylindrical conductors, the voltage $V_0$ produced between the cylindrical conductors is given by the following equation (1), assuming that the length L is sufficiently longer than the radius $t_a$ and the radius $t_b$:

$$V_0 = \frac{Q}{2\pi\varepsilon\varepsilon_0 L}\ln\frac{t_b}{t_a} \quad (1)$$

where $\varepsilon$ is the relative permittivity of the space between the cylindrical conductors, and $\varepsilon_0$ is the vacuum permittivity.

On the other hand, the electric field $E_0$ in the space between the cylindrical conductors is given by the following equation (2):

$$E_0 = \frac{Q}{2\pi r \varepsilon \varepsilon_0} \quad (2)$$

where r is the distance (radius) from the central axis of the cylindrical conductors, with $t_a < r < t_b$.

On the basis of equation (1), the potential difference $V_1$ between the semiconductor pillar SP and the electrode film WL in the first region RG1 is given by the following equations (3)-(5), where $Q_1$ is the amount of charge placed on the semiconductor pillar SP and the electrode film WL, and L is the length of the semiconductor pillar SP in the Z-axis direction.

$$V_1 = \frac{Q_1}{2\pi\varepsilon_0 L}\left(\frac{1}{\varepsilon_1}\ln\frac{t_{11}+t_{12}}{t_{11}} + \frac{1}{\varepsilon_2}\ln\frac{t_{11}+t_{12}+t_{13}}{t_{11}+t_{12}} + \frac{1}{\varepsilon_3}\ln\frac{t_{11}+t_{12}+t_{13}+t_{14}}{t_{11}+t_{12}+t_{13}}\right) \quad (3)$$

$$A_1 = \frac{1}{\varepsilon_1}\ln\frac{t_{11}+t_{12}}{t_{11}} + \frac{1}{\varepsilon_2}\ln\frac{t_{11}+t_{12}+t_{13}}{t_{11}+t_{12}} + \frac{1}{\varepsilon_3}\ln\frac{t_{11}+t_{12}+t_{13}+t_{14}}{t_{11}+t_{12}+t_{13}} \quad (4)$$

$$V_1 = \frac{Q_1 A_1}{2\pi\varepsilon_0 L} \quad (5)$$

On the basis of equation (2), the electric field $E_1$ at the surface of the inner insulating film 42 on the semiconductor pillar SP side (at the surface near the semiconductor pillar SP) in the first region RG1 is given by the following equations (6) and (7):

$$E_1 = \frac{Q_1}{2\pi r_1 \varepsilon_1 \varepsilon_0} \quad (6)$$

$$E_1 = \frac{LV_1}{r_1 \varepsilon_1 A_1} \quad (7)$$

where $r_1$ is the distance (radius) from the central axis of the semiconductor pillar SP, with $t_{11} < r_i < t_{12}$. However, it is possible here to set $r_1 = t_{11}$.

Likewise, the potential difference $V_2$ between the semiconductor pillar SP and the electrode film WL in the second region RG2 is given by the following equations (8)-(10), where $Q_2$ is the amount of charge placed on the semiconductor pillar SP and the electrode film WL.

$$V_2 = \frac{Q_2}{2\pi\varepsilon_0 L}\left(\frac{1}{\varepsilon_1}\ln\frac{t_{21}+t_{22}}{t_{21}} + \frac{1}{\varepsilon_2}\ln\frac{t_{21}+t_{22}+t_{23}}{t_{21}+t_{22}} + \frac{1}{\varepsilon_3}\ln\frac{t_{21}+t_{22}+t_{23}+t_{24}}{t_{21}+t_{22}+t_{23}}\right) \quad (8)$$

$$A_2 = \frac{1}{\varepsilon_1}\ln\frac{t_{21}+t_{22}}{t_{21}} + \frac{1}{\varepsilon_2}\ln\frac{t_{21}+t_{22}+t_{23}}{t_{21}+t_{22}} + \frac{1}{\varepsilon_3}\ln\frac{t_{21}+t_{22}+t_{23}+t_{24}}{t_{21}+t_{22}+t_{23}} \quad (9)$$

$$V_2 = \frac{Q_2 A_2}{2\pi\varepsilon_0 L} \quad (10)$$

The electric field $E_2$ at the surface of the inner insulating film 42 on the semiconductor pillar SP side (at the surface near the semiconductor pillar SP) in the second region RG2 is given by the following equations (11) and (12):

$$E_2 = \frac{Q_2}{2\pi r_2 \varepsilon_1 \varepsilon_0} \quad (11)$$

$$E_2 = \frac{LV_2}{r_2 \varepsilon_1 A_2} \quad (12)$$

where $r_2$ is the distance (radius) from the central axis of the semiconductor pillar SP, with $t_{21} < r_2 < t_{22}$. However, it is possible here to effectively set $r_2 = t_{21}$.

Here, if the same operation is expected in the upper portion and the lower portion, that is, if $V_1 = V_2$ and $Q_1 = Q_2$, then the condition for equality between the electric field $E_1$ and the electric field $E_2$ is $r_1 \cdot A_1 = r_2 \cdot A_2$. That is, the electric field at the surface of the inner insulating film 42 on the semiconductor pillar SP side can be equalized in the first region RG1 and in the second region RG2 when the following equation (13) is satisfied:

$$t_{11}\left(\frac{1}{\varepsilon_1}\ln\frac{t_{11}+t_{12}}{t_{11}} + \frac{1}{\varepsilon_2}\ln\frac{t_{11}+t_{12}+t_{13}}{t_{11}+t_{12}} + \frac{1}{\varepsilon_3}\ln\frac{t_{11}+t_{12}+t_{13}+t_{14}}{t_{11}+t_{12}+t_{13}}\right) = \\ t_{21}\left(\frac{1}{\varepsilon_1}\ln\frac{t_{21}+t_{22}}{t_{21}} + \frac{1}{\varepsilon_2}\ln\frac{t_{21}+t_{22}+t_{23}}{t_{21}+t_{22}} + \frac{1}{\varepsilon_3}\ln\frac{t_{21}+t_{22}+t_{23}+t_{24}}{t_{21}+t_{22}+t_{23}}\right) \quad (13)$$

Here, in the nonvolatile semiconductor memory device 110, the film thickness (thickness along the Y-axis direction) of the inner insulating film 42 and the memory layer 48 is preferably equal in the upper portion and in the lower portion. Thus, it is preferable to satisfy equation (13) by adjusting at least one of the diameter of the semiconductor pillar SP and the film thickness of the outer insulating film 43. Furthermore, from the viewpoint of manufacturability, at least the thickness of the outer insulating film 43 is varied between the upper portion and the lower portion.

Specifically, the thickness of the outer insulating film 43 in the first region RG1 is made thicker than the thickness in the second region RG2. Then, the thickness of the inner insulating film 42 and the memory layer 48 can be made constant. Thus, for instance, the diameter of the inner insulating film 42 (the diameter of the boundary between the inner insulating film 42 and the semiconductor pillar SP) can be substantially equalized in the first region RG1 and in the second region RG2.

More specifically, for instance, the curvature (curvature radius) of the inner insulating film 42 can be substantially equalized in the first region RG1 and in the second region RG2. Thus, the electric field applied to the inner insulating film 42 (the electric field applied to the surface of the inner insulating film 42 on the semiconductor pillar SP side) can be substantially equalized in the first region RG1 and in the second region RG2. Thus, a nonvolatile semiconductor memory device can be realized with good operating characteristics by compensating for the variation of electric field due to the variation in the diameter of the through hole TH.

In the following, a model-based description is given of the electric field in the nonvolatile semiconductor memory device 110 in comparison with a comparative example.

Figure 5A:
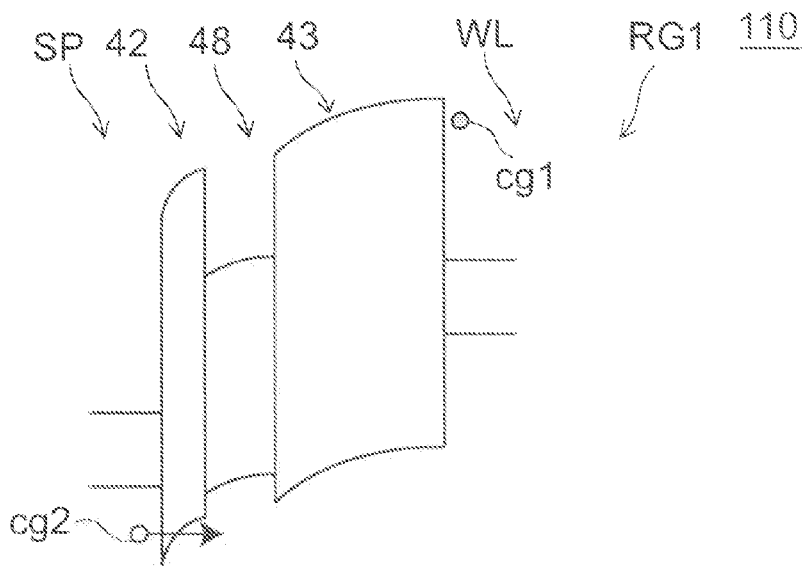
FIGS. 5A to 5C are schematic views illustrating the characteristics of the nonvolatile semiconductor memory device according to the first embodiment and a nonvolatile semiconductor memory device of a comparative example.
Figure 5B:
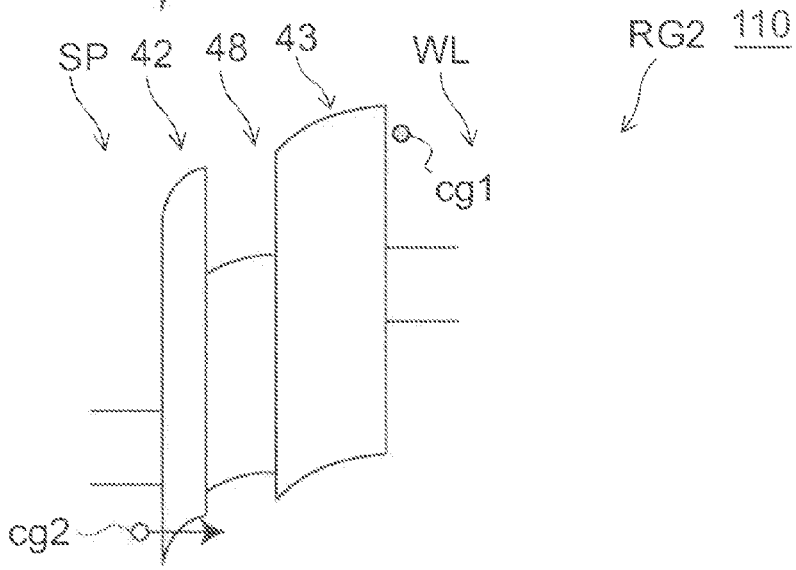
Figure 5C:
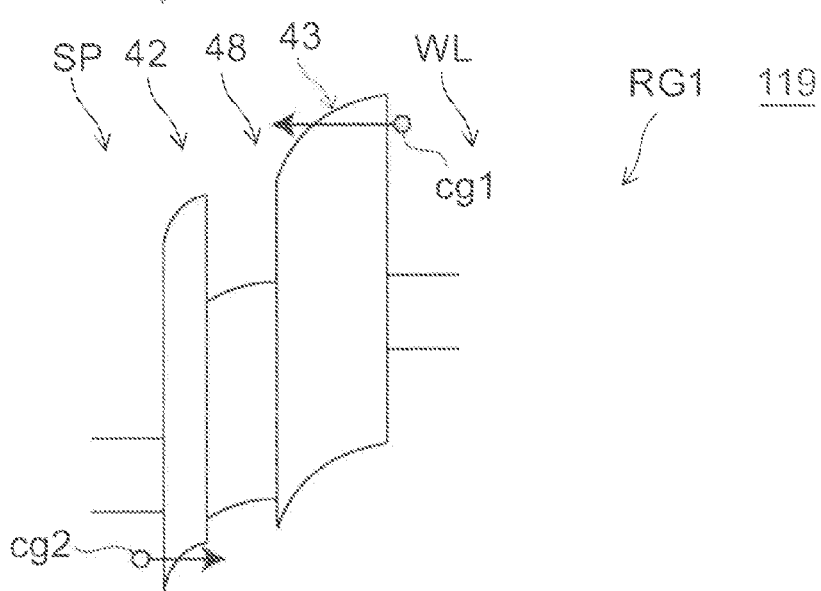

FIGS. 5A to 5C are schematic diagrams illustrating the characteristics of the nonvolatile semiconductor memory device according to the first embodiment and a nonvolatile semiconductor memory device of the comparative example.

More specifically, FIGS. 5A and 5B are energy band diagrams of the nonvolatile semiconductor memory device 110 in the first region RG1 and the second region RG2, respectively, and FIG. 5C is an energy band diagram of the nonvolatile semiconductor memory device 119 of the comparative example in the first region RG1.

These illustratively show characteristics during the erase operation. The erase operation is the operation of performing at least one of injection of holes into the memory layer 48, and extraction of electrons from the memory layer 48. In the following, for simplicity of description, it is assumed that the erase operation is injection of holes into the memory layer 48.

As shown in FIG. 5B, in the nonvolatile semiconductor memory device 110, in the second region RG2 where the diameter of the through hole TH (the outer diameter of the outer insulating film 43) is small, the applied electric field causes holes cg2 to be injected from the semiconductor pillar SP side toward the memory layer 48 through the inner insulating film 42. Here, because the curvature of the outer insulating film 43 is smaller than the curvature of the inner insulating film 42, the electric field applied to the outer insulating film 43 can be made lower than the electric field applied to the inner insulating film 42. This can suppress injection of electrons cg1 (reverse injection) from the electrode film WL side toward the memory layer 48 through the outer insulating film 43, and the erase operation is normally performed.

On the other hand, as shown in FIG. 5A, in the first region RG1 where the diameter of the through hole TH is large, the outer insulating film 43 is designed to be thicker than in the second region RG2. Thus, for instance, the electric field in the inner insulating film 42 can be substantially equalized in the first region RG1 and in the second region RG2. Thus, also in the first region RG1, like the second region, the applied electric field causes holes cg2 to be injected from the semiconductor pillar SP side toward the memory layer 48 through the inner insulating film 42. Here, the thickness of the outer insulating film 43 in the first region RG1 is designed to be thicker than that in the second region RG2, and hence the electric field applied to the outer insulating film 43 is kept low as in the second region RG2, for instance. This suppresses reverse injection of electrons cg1 from the electrode film WL side toward the memory layer 48, and the erase operation is normally performed.

In contrast, in the nonvolatile semiconductor memory device 119 of the comparative example, the thickness of the outer insulating film 43 is designed to be equal on the upper side with the diameter of the through hole TH being large and on the lower side with the diameter being small. Furthermore, the thickness of the inner insulating film 42 and the memory layer 48 is designed to be equal on the upper side and on the lower side, and consequently, the inner diameter of the inner insulating film 42 on the upper side is larger than that on the lower side. That is, the curvature of the inner insulating film 42 on the upper side is smaller than that on the lower side. The rest is the same as the nonvolatile semiconductor memory device 110. That is, the configuration and operation of the lower side are the same as those in the nonvolatile semiconductor memory device 110, and the description thereof is omitted.

As shown in FIG. 5C, in the nonvolatile semiconductor memory device 119 of the comparative example, because the curvature of the inner insulating film 42 on the upper side is smaller than that on the lower side, the electric field applied to the inner insulating film 42 on the upper side is lower than that on the lower side. In this configuration, to perform the erase operation, a high voltage is applied so that holes cg2 are injected from the semiconductor pillar SP side toward the memory layer 48. Here, because the film thickness of the outer insulating film 43 is designed to be equal on the upper side and on the lower side, the electric field applied to the upper side of the outer insulating film 43 is higher than in the nonvolatile semiconductor memory device 110 according to the embodiment. This results in reverse injection of electrons cg1 from the electrode film WL side toward the memory layer 48, interfering with the erase operation.

In contrast, in the nonvolatile semiconductor memory device 110, the thickness of the outer insulating film 43 in the first region RG1 is designed to be thicker than that in the second region RG2. Thus, the electric field applied to the outer insulating film 43 is kept low. This can suppress reverse injection of electrons cg1 and achieve a normal erase operation.

In the foregoing, for simplicity, a model-based description has been given with reference to the case where the thickness of the outer insulating film 43 in the first region RG1 is thicker than that in the second region RG2 so that the inner diameter of the inner insulating film 42 is substantially equalized in the first region RG1 and in the second region RG2. However, it is only necessary that the thickness of the outer insulating film 43 in the first region RG1 is thicker than that in the second region RG2. Thus, for instance, the electric field applied to the inner surface of the inner insulating film 42 is substantially equalized in the first region RG1 and in the second region RG2. That is, for instance, equation (13) is satisfied.

Making the thickness of the outer insulating film 43 in the first region RG1 thicker than that in the second region RG2 has not only the effect of reducing the thickness of the outer insulating film 43 to reduce the electric field applied to the outer insulating film 43, but also the effect of adjusting the radius of the semiconductor pillar SP to adjust the curvature of the inner surface of the inner insulating film 42 so that the electric field applied to the inner surface of the inner insulating film 42 is consequently adjusted to a desired level. For instance, consider the following case: the diameter of the through hole TH in the first region RG1 is 83 nm (nanometers), the diameter of the through hole TH in the second region RG2 is 77 nm, the inner insulating film 42 and the outer insulating film 43 are made of silicon oxide film, the memory layer 48 is made of silicon nitride film, and in both the first region RG1 and the second region RG2, the thickness of the inner insulating film 42 is 6 nm, and the thickness of the memory layer 48 is 3 nm. Then, to satisfy equation (13), in the first region RG1, the thickness of the outer insulating film 43 (first outer insulating film thickness $t_{14}$) is set to 23.5 nm, and the radius of the semiconductor pillar SP (first semiconductor pillar thickness $t_{11}$) is set to 9 nm, and in the second region RG2, the thickness of the outer insulating film 43 (second outer insulating film thickness $t_{24}$) is set to 13 nm, and the radius of the semiconductor pillar SP (second semiconductor pillar thickness $t_{21}$) is set to 16.5 nm.

Thus, the first outer insulating film thickness $t_{14}$ (23.5 nm) is designed to be thicker than the second outer insulating film thickness $t_{24}$ (13 nm), and the first semiconductor pillar thickness $t_{11}$ (9 nm) is designed to be smaller than the second semiconductor pillar thickness $t_{21}$ (16.5 nm).

On the other hand, in the aforementioned comparative example, the lower side with the diameter of the through hole TH being 77 nm has a configuration similar to that of the nonvolatile semiconductor memory device 110, where the thickness of the outer insulating film 43 is 13 nm, the thickness of the memory layer 48 is 3 nm, the thickness of the inner insulating film 42 is 6 nm, and the radius of the semiconductor pillar SP is 16.5 nm. Here, on the upper side with the diameter of the through hole TH being 83 nm, the thickness of the outer insulating film 43 is 13 nm, the thickness of the memory layer 48 is 3 nm, the thickness of the inner insulating film 42 is 6 nm, and the radius of the semiconductor pillar SP is 19.5 nm. Thus, the radius of the semiconductor pillar SP on the upper side is larger than that on the lower side, consequently interfering with the erase operation.

Here, the electric field applied to the outer insulating film 43 can be made lower than that applied to the inner insulating film 42 by using materials having different relative permittivities for the inner insulating film 42 and the outer insulating film 43. However, in the nonvolatile semiconductor memory device 110, the electric field in the outer insulating film 43 can be made lower than that in the inner insulating film 42 by the shape effect of reducing the curvature of the outer insulating film 43 relative to the inner insulating film 42. Thus, even in the case where the inner insulating film 42 and the outer insulating film 43 are made of materials having the same relative permittivity, reverse injection of electrons cg1 toward the outer insulating film 43 is easily suppressed. That is, by taking advantage of difference in curvature, both the inner insulating film 42 and the outer insulating film 43 can be made of silicon oxide film (silicon oxide) having high consistency of process integration and high reliability.

The configuration of the nonvolatile semiconductor memory device 110, which is an example of this embodiment, is further described.

As shown in FIGS. 3 and 4, in the nonvolatile semiconductor memory device 110, two semiconductor pillars SP are connected by a connecting portion CP. More specifically, the memory unit MU of the nonvolatile semiconductor memory device 110 further includes a second semiconductor pillar SP2 and a first connecting portion CP1 (connecting portion CP). The second semiconductor pillar SP2 is included in the semiconductor pillars SP.

The second semiconductor pillar SP2 is adjacent to the first semiconductor pillar SP1 illustratively in the Y-axis direction and pierces the stacked structure ML in the Z-axis direction.

The memory layer 48 is provided also between each electrode film WL and the second semiconductor pillar SP2. The inner insulating film 42 is provided also between the second semiconductor pillar SP2 and the memory layer 48. The outer insulating film 43 is provided also between the electrode film WL and the memory layer 48b for the second semiconductor pillar.

The first connecting portion CP1 electrically connects between the first semiconductor pillar SP1 and the second semiconductor pillar SP2 on the same side (the substrate 11 side) in the Z-axis direction. The first connecting portion CP1 extends in the Y-axis direction. The first connecting portion CP1 is made of the same material as the first and second semiconductor pillar SP1 and SP2.

For instance, a back gate BG (connecting conductive layer) is provided on the major surface 11a of the substrate 11 via the interlayer insulating film 13. A trench is provided in portions of the back gate BG opposed to the first and second semiconductor pillar SP1 and SP2. Films each serving as an outer insulating film 43, a memory layer 48, and an inner insulating film 42 are formed inside the trench, and the remaining space is filled with a connecting portion CP made of a semiconductor. It is noted that the formation of films serving as the outer insulating film 43, the memory layer 48, and the inner insulating film 42, and of the connecting portion CP in the trench is performed simultaneously and collectively with the formation of the outer insulating film 43, the memory layer 48, the inner insulating film 42, and the semiconductor pillar SP in the through hole TH. Thus, the back gate BG is provided opposite to the connecting portion CP.

Thus, the first and second semiconductor pillar SP1 and SP2, and the connecting portion CP are formed into a U-shaped semiconductor pillar, which constitutes a U-shaped memory string. This memory string is composed of NAND cell units.

As shown in FIGS. 3 and 4, the opposite end of the first semiconductor pillar SP1 from the first connecting portion CP1 is connected to a bit line BL, and the opposite end of the second semiconductor pillar SP2 from the first connecting portion CP1 is connected to a source line SL. Here, the semiconductor pillar SP is connected to the bit line BL by vias 22 (via VA1 and via VA2).

In this example, the bit line BL extends in the Y-axis direction, and the source line SL extends in the X-axis direction. Between the stacked structure ML and the bit line BL, a drain side selection gate electrode SGD (first selection gate electrode SG1) is provided opposite to the first semiconductor pillar SP1, and a source side selection gate electrode SGS (second selection gate electrode SG2) is provided opposite to the second semiconductor pillar SP2. Thus, desired data can be written to and read from an arbitrary memory cell MC of an arbitrary semiconductor pillar SP. The drain side selection gate electrode SGD and the source side selection gate electrode SGS are included in selection gate electrodes SG.

The selection gate electrode SG can be made of any conductive material, such as polysilicon or amorphous silicon. In this example, the selection gate electrode SG is divided in the Y-axis direction and shaped like strips extending in the X-axis direction.

As shown in FIG. 3, an interlayer insulating film 15 is provided at the top (on the side farthest from the substrate 11) of the stacked structure ML. Furthermore, an interlayer insulating film 16 is provided on the stacked structure ML, a selection gate electrode SG is provided thereon, and an interlayer insulating film 17 is provided between the selection gate electrodes SG. A through hole is provided in the selection electrode SG, a selection gate insulating film SGI of a selection gate transistor is provided on the inner side surface thereof, and a semiconductor is buried inside it. This semiconductor is connected to the semiconductor pillar SP.

Furthermore, an interlayer insulating film 18 is provided on the interlayer insulating film 17, and a source line SL and vias 22 (vias VA1, VA2) are provided thereon, and an interlayer insulating film 19 is provided around the source line SL. Furthermore, an interlayer insulating film 23 is provided on the source line SL, and a bit line BL is provided thereon. The bit line BL is shaped like a strip along the Y axis.

The interlayer insulating films 15, 16, 17, 18, 19, and 23, and the selection gate insulating film SGI can illustratively be silicon oxide films.

Here, with regard to the plurality of semiconductor pillars provided in the nonvolatile semiconductor memory device 110, when all or any of the semiconductor pillars are referred to, the wording "semiconductor pillar SP" is used. On the other hand, when a particular semiconductor pillar is referred to in describing the relationship between the semiconductor pillars, for instance, the wording "n-th semiconductor pillar SPn" (n is any integer of one or more) is used.

Figure 6:
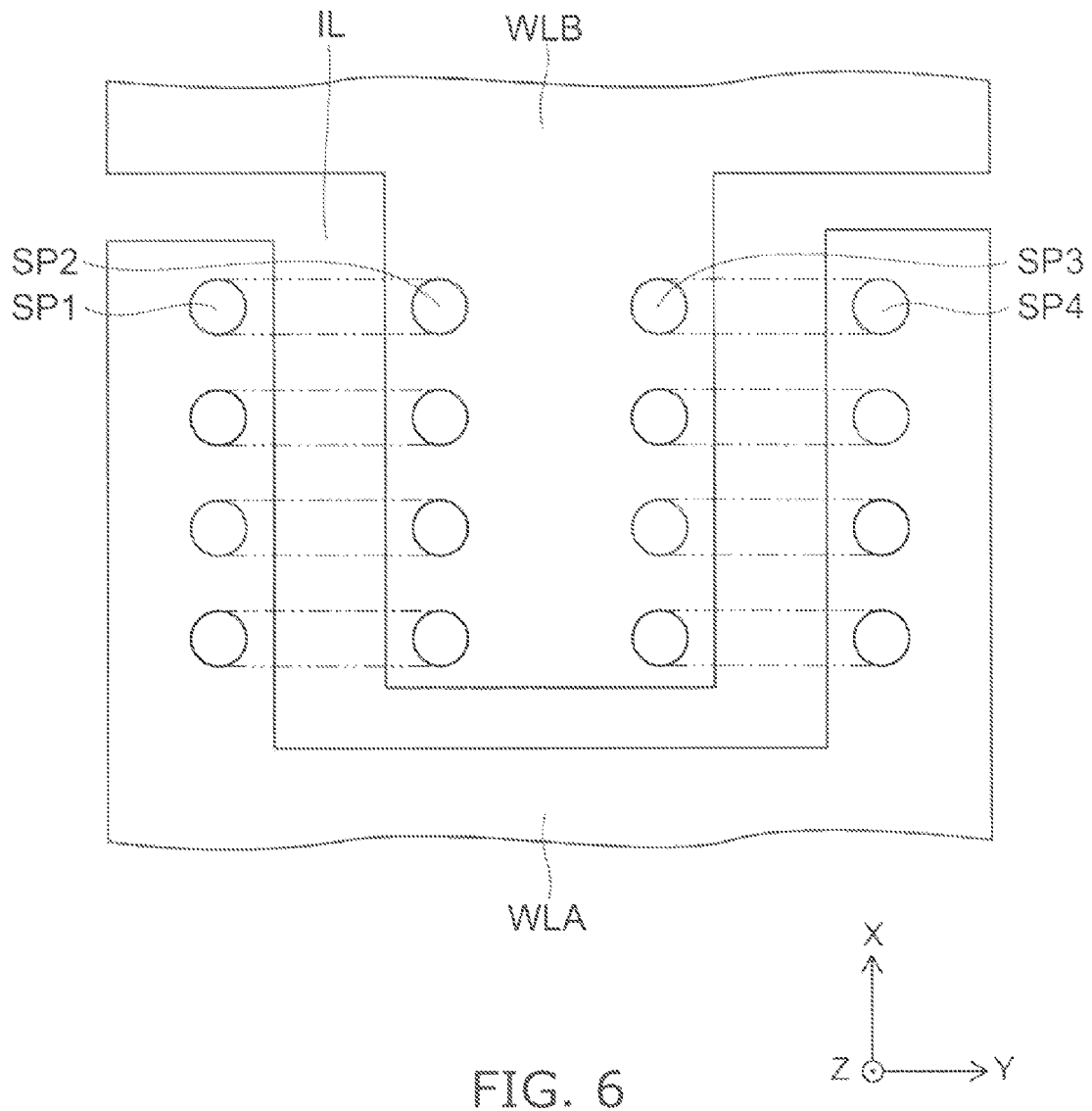
FIG. 6 is a schematic plan view illustrating the configuration of an electrode film of the nonvolatile semiconductor memory device according to the first embodiment.

FIG. 6 is a schematic plan view illustrating the configuration of the electrode films of the nonvolatile semiconductor memory device according to the first embodiment.

As shown in FIG. 6, among the electrode films WL, the electrode films corresponding to the semiconductor pillars with n being equal to 4 m+1 and 4 m+4, or the semiconductor pillars SP(4 m+1) and SP(4 m+4), are commonly connected into an electrode film WLA, and the electrode films corresponding to the semiconductor pillars with n being equal to 4 m+2 and 4 m+3, or the semiconductor pillars SP(4 m+2) and SP(4 m+3), are commonly connected into an electrode film WLB, where m is an integer of zero or more. That is, the electrode films WL are shaped into the electrode film WLA and the electrode film WLB which are opposed in the X-axis direction and meshed with each other like comb teeth.

As shown in FIGS. 3 and 6, the electrode film WL is divided by an insulating layer IL into a first region (electrode film WLA) and a second region (electrode film WLB).

Furthermore, as in the interconnection connecting unit MU2 illustrated in FIG. 3, at one end in the X-axis direction, the electrode film WLB is connected to a word interconnection 32 by a via plug 31 and electrically connected to, for instance, a driving circuit provided in the substrate 11. Likewise, at the other end in the X-axis direction, the electrode film WLA is connected to a word interconnection by a via plug and electrically connected to a driving circuit. That is, the length in the X-axis direction of the electrode films WL (electrode film WLA and electrode film WLB) stacked in the Z-axis direction is varied stepwise, so that electrical connection to the driving circuit is implemented by the electrode film WLA at one end in the X-axis direction and by the electrode film WLB at the other end in the X-axis direction.

Furthermore, as shown in FIGS. 3 and 4, the memory unit MU can further include a third semiconductor pillar SP3, a fourth semiconductor pillar SP4, and a second connecting portion CP2. The third semiconductor pillar SP3 and the fourth semiconductor pillar SP4 are included in the semiconductor pillars SP, and the second connecting portion CP2 is included in the connecting portions CP.

The third semiconductor pillar SP3 is adjacent to the second semiconductor pillar SP2 on the opposite side of the second semiconductor pillar SP2 from the first semiconductor pillar SP1 in the Y-axis direction and pierces the stacked structure ML in the Z-axis direction. The fourth semiconductor pillar SP4 is adjacent to the third semiconductor pillar SP3 on the opposite side of the third semiconductor pillar SP3 from the second semiconductor pillar SP2 in the Y-axis direction and pierces the stacked structure ML in the Z-axis direction.

The second connecting portion CP2 electrically connects between the third semiconductor pillar SP3 and the fourth semiconductor pillar SP4 on the same side (as the first connecting portion CP1) in the Z-axis direction. The second connecting portion CP2 extends in the Y-axis direction and is opposed to the back gate BG.

The memory layer 48 is provided also between each electrode film WL and the third and fourth semiconductor pillar SP3 and SP4, and between the back gate BG and the second connecting portion CP2. The inner insulating film 42 is provided also between the third and fourth semiconductor pillar SP3 and SP4 and the memory layer 48, and between the memory layer 48 and the second connecting portion CP2. The outer insulating film 43 is provided also between each electrode film WL and the memory layer 48 for the third and fourth semiconductor pillar SP3 and SP4, and between the memory layer 48 for the second connecting portion CP2 and the back gate BG.

The source line SL is connected to the third end portion of the third semiconductor pillar SP3 on the opposite side from the second connecting portion CP2. The bit line BL is connected to the fourth end portion of the fourth semiconductor pillar SP4 on the opposite side from the second connecting portion CP2.

Furthermore, a source side selection gate electrode SGS (third selection gate electrode SG3) is provided opposite to the third semiconductor pillar SP3, and a drain side selection gate electrode SGD (fourth selection gate electrode SG4) is provided opposite to the fourth semiconductor pillar SP4. The source side selection gate electrode SGS and the drain side selection gate electrode SGD are included in the selection gate electrodes SG.

In the following, an example method for manufacturing the nonvolatile semiconductor memory device 110 is described.

FIGS. 7A to 7D are sequential schematic cross-sectional views illustrating a method for manufacturing a nonvolatile semiconductor memory device according to the first embodiment.

Figure 7A:
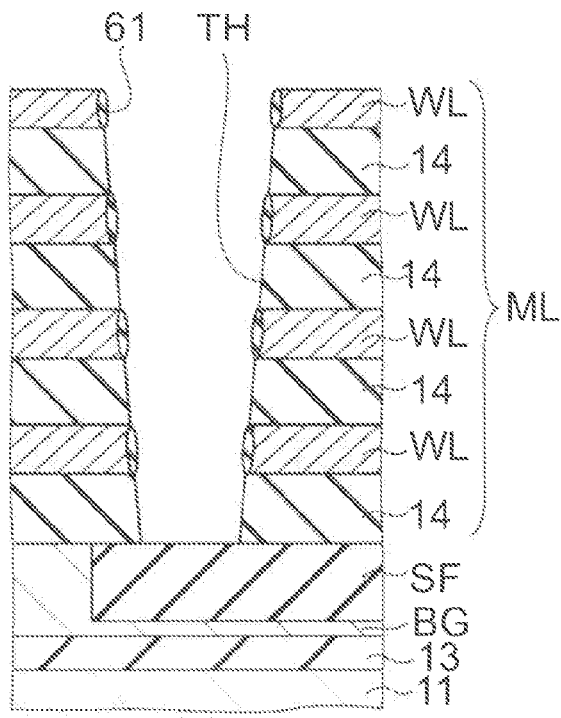
FIGS. 7A to 7D are sequential schematic cross-sectional views illustrating a method for manufacturing a nonvolatile semiconductor memory device according to the first embodiment.
Figure 7B:
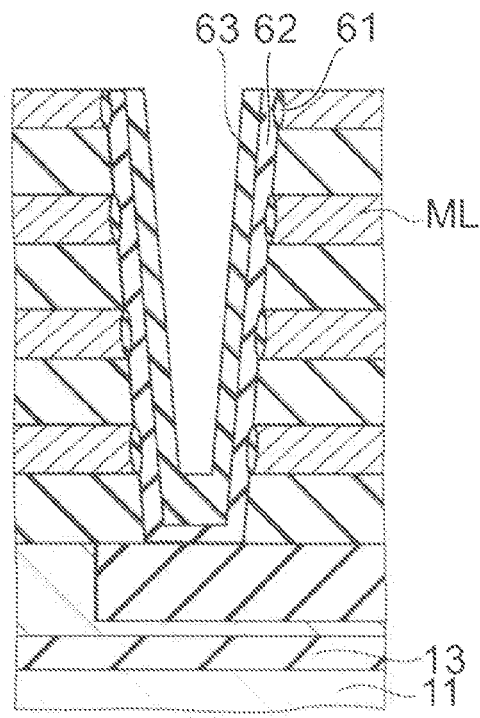
Figure 7C:
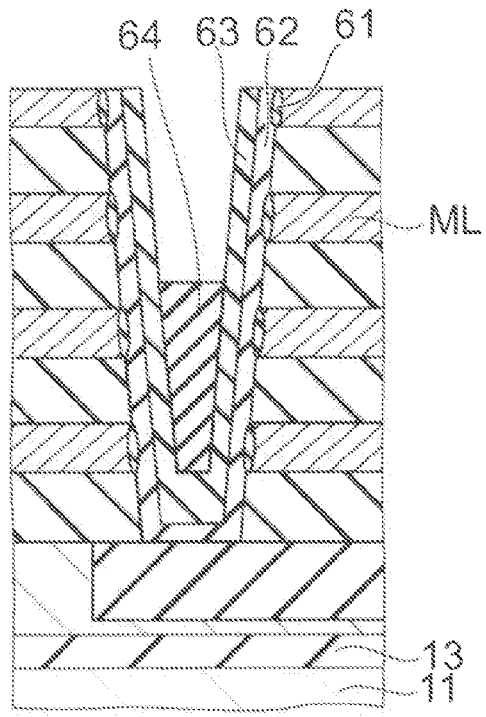
Figure 7D:
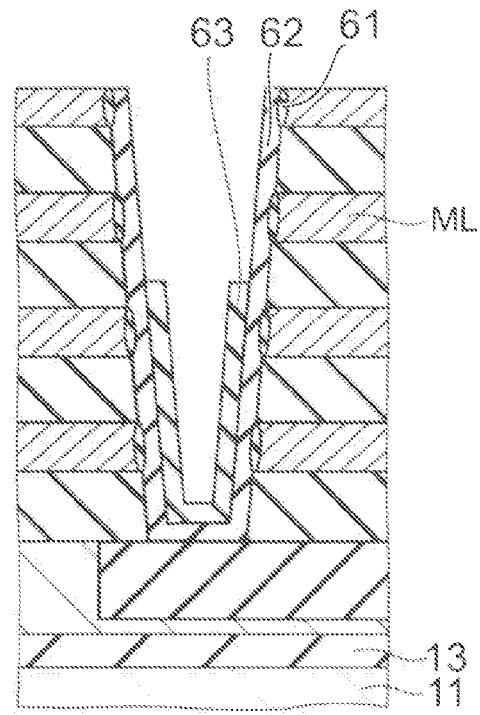
Figure 8A:
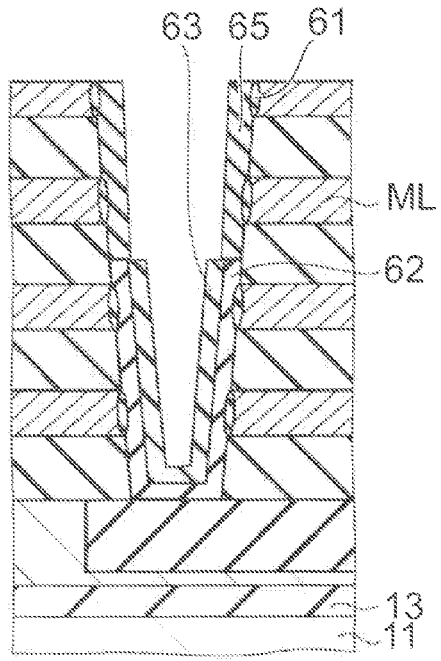
FIGS. 8A to 8C are sequential schematic cross-sectional views illustrating the method for manufacturing the nonvolatile semiconductor memory device according to the first embodiment, following FIG. 7D.
Figure 8B:
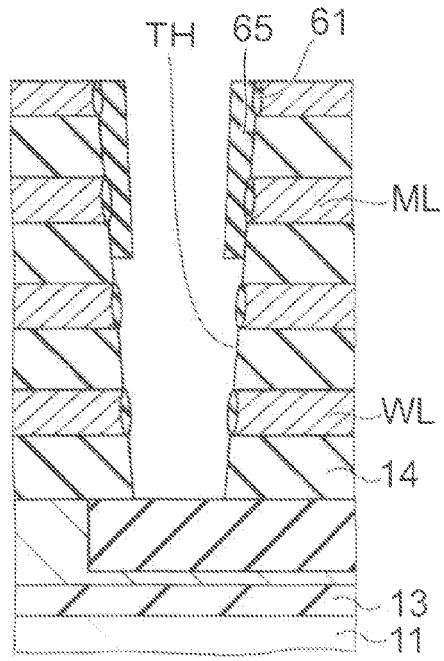
Figure 8C:
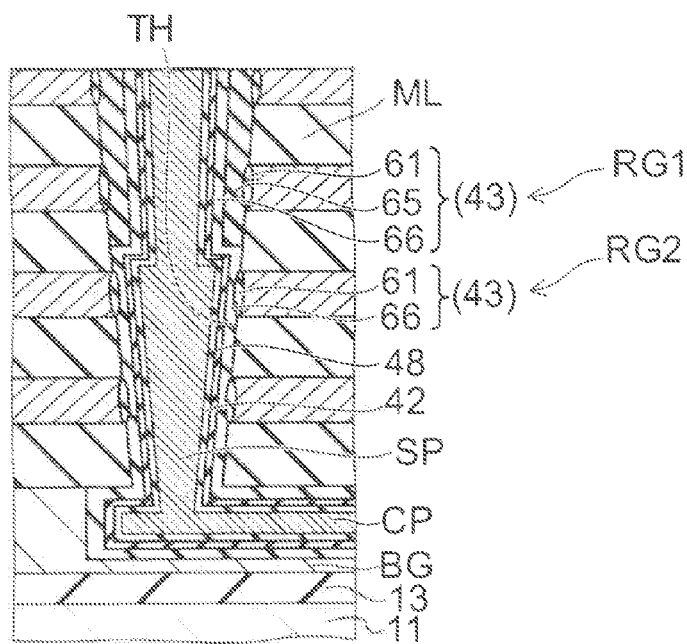

FIGS. 8A to 8C are sequential schematic cross-sectional views following FIGS. 7A to 7D.

First, as shown in FIG. 7A, on a substrate 11 illustratively made of silicon, an interlayer insulating film 13 is formed, and then a conductive film (illustratively made of impurity-doped amorphous silicon or amorphous silicon) is formed thereon to form a back gate BG. In this back gate BG, lithography and RIE (reactive ion etching) are used to form a trench pattern in which a connecting portion CP is to be formed, and a sacrificial layer SF made of silicon nitride film is buried in this trench pattern.

Interelectrode insulating films 14 and electrode films WL are alternately deposited thereon for a desired number of repetitions, and an interlayer insulating film 15 (not shown) is deposited thereon to form a stacked structure ML. The electrode film WL is made of polysilicon, and the interelectrode insulating film 14 is illustratively made of silicon oxide film.

Subsequently, a through hole TH piercing the stacked structure ML and the interlayer insulating film 13 in the Z-axis direction and reaching the sacrificial layer SF is formed. Then, the side surface of the polysilicon film of the electrode film WL exposed to the through hole TH is oxidized to form a side surface insulating film 61 made of silicon oxide film.

Then, as shown in FIG. 7B, an amorphous silicon layer 62 is formed on the inner wall surface of the through hole TH, and a silicon nitride film 63 is further formed.

Then, as shown in FIG. 7C, the remaining space of the through hole TH is filled with a resist 64. The resist 64 is recessed (set back) to expose the silicon nitride film 63 on the upper side of the stacked structure ML.

Then, as shown in FIG. 7D, the silicon nitride film 63 exposed from the resist 64 is removed illustratively by CDE (chemical dry etching) to expose the amorphous silicon layer 62 on the upper side of the stacked structure ML.

Then, as shown in FIG. 8A, the exposed amorphous silicon layer 62 is oxidized to form an upper silicon oxide film 65 on the inner wall surface of the through hole TH on the upper side of the stacked structure ML.

Then, as shown in FIG. 8B, the silicon nitride film 63 is removed illustratively by high-temperature phosphoric acid treatment. Then, the amorphous silicon layer 62 is removed by the alkaline wet etching process to expose the electrode films WL and the interelectrode insulating films 14 in the lower portion of the through hole TH.

Then, as shown in FIG. 8C, after the sacrificial layer SF is removed, an insulating film 66, a memory layer 48, and an inner insulating film 42 are formed on the inner wall surface of the lower portion of the through hole TH and on the inner wall surface of the upper silicon oxide film 65, and the inside thereof is filled with a semiconductor to form a semiconductor pillar SP and a connecting portion CP. The insulating film 66 is illustratively a silicon oxide film.

In the upper portion of the through hole TH, that is, in the first region RG1, the stacked film of the side surface insulating film 61, the upper silicon oxide film 65, and the insulating film 66 constitute the outer insulating film 43. In the lower portion of the through hole TH, that is, in the second region RG2, the side surface insulating film 61 and the insulating film 66 constitute the outer insulating film 43. Thus, the thickness of the outer insulating film 43 in the first region RG1 can be made thicker than that in the second region RG2.

By subsequently performing prescribed processes, or by appropriately performing other processes during the above process, the nonvolatile semiconductor memory device 110 can be manufactured.

When the nonvolatile semiconductor memory device 110 is formed in accordance with the above manufacturing method, the thickness of the outer insulating film 43 discontinuously varies at the boundary between the region provided with the upper silicon oxide film 65 and the region not provided therewith. That is, the thickness of the outer insulating film 43 along the Y-axis direction discontinuously varies along the Z-axis direction. Thus, the thickness of the outer insulating film 43 can be varied by a relatively simple manufacturing method with high controllability.

Figure 9:
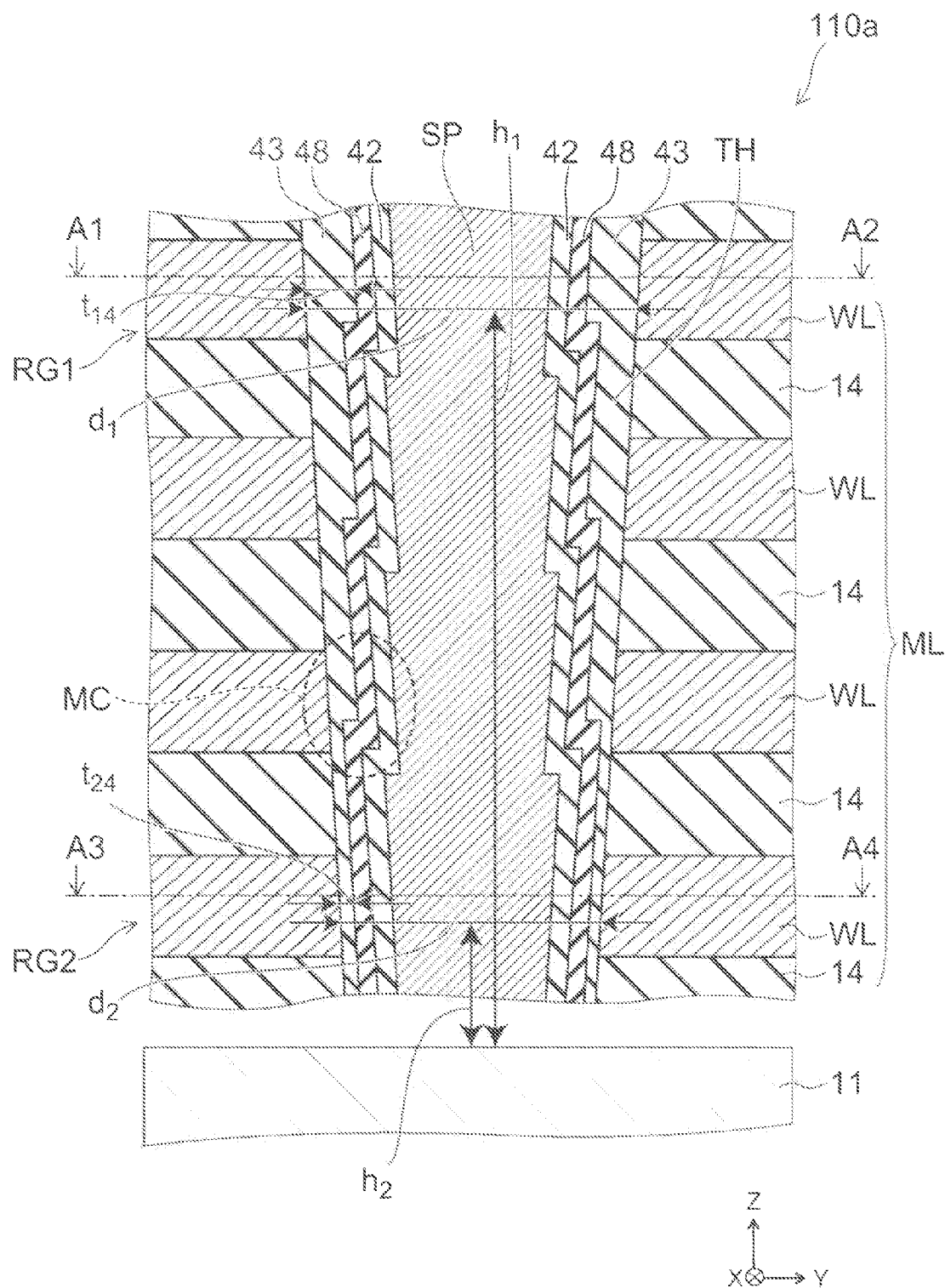
FIG. 9 is a schematic cross-sectional view illustrating the configuration of another nonvolatile semiconductor memory device according to the first embodiment.

FIG. 9 is a schematic cross-sectional view illustrating the configuration of an alternative nonvolatile semiconductor memory device according to the first embodiment.

As shown in FIG. 9, in another nonvolatile semiconductor memory device 110a according to this embodiment, the thickness of the outer insulating film 43 varies in four steps. That is, the thickness of the outer insulating film 43 on a side near the substrate 11 is thinnest and the thickness of the outer insulating film 43 increases stepwise with being apart from the substrate 11 along the Z-axis direction. Thus, the number of regions where the thickness of the outer insulating film 43 is different is arbitrary.

In this manner, the thickness of the outer insulating film 43 can be varied discontinuously. However, the embodiment of the invention is not limited thereto, but the continuity in the variation of the outer insulating film 43 is arbitrary.

Figure 10:
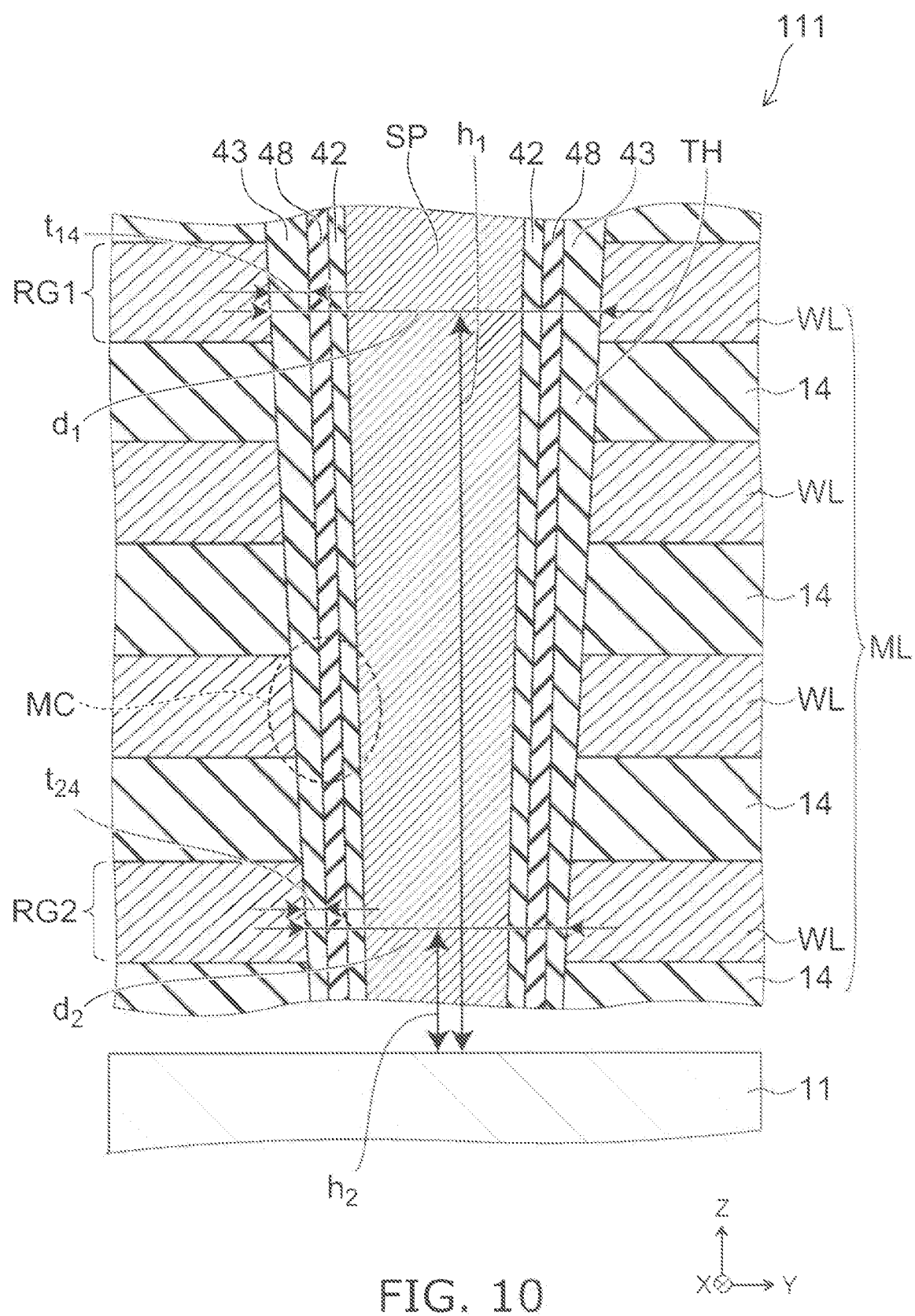
FIG. 10 is a schematic cross-sectional view illustrating the configuration of another nonvolatile semiconductor memory device according to the first embodiment.

FIG. 10 is a schematic cross-sectional view illustrating the configuration of an alternative nonvolatile semiconductor memory device according to the first embodiment.

As shown in FIG. 10, also in the alternative nonvolatile semiconductor memory device 111 according to this embodiment, the through hole TH is tapered with the diameter in the upper portion being large and the diameter in the lower portion being small. The thickness of the outer insulating film 43 along the Y-axis direction in the first region RG1 located at a long distance h1 from the substrate 11 as viewed in the Z-axis direction is thicker than the thickness of the outer insulating film 43 along the Y-axis direction in the second region RG2 located at a shorter distance h2 relative to the first region RG1 as viewed in the Z-axis direction. That is, in the first region RG1 where the outer diameter of the outer insulating film 43 along the Y-axis direction perpendicular to the Z-axis direction is large, the thickness of the outer insulating film 43 along the Y-axis direction is thicker than that in the second region RG2 where the outer diameter is small. Furthermore, in this case, the thickness of the outer insulating film 43 continuously varies in the Z-axis direction.

Also in this case, good operating characteristics can be achieved by compensating for the variation of electric field due to the variation in the diameter of the through hole TH.

Second Embodiment

Figure 11:
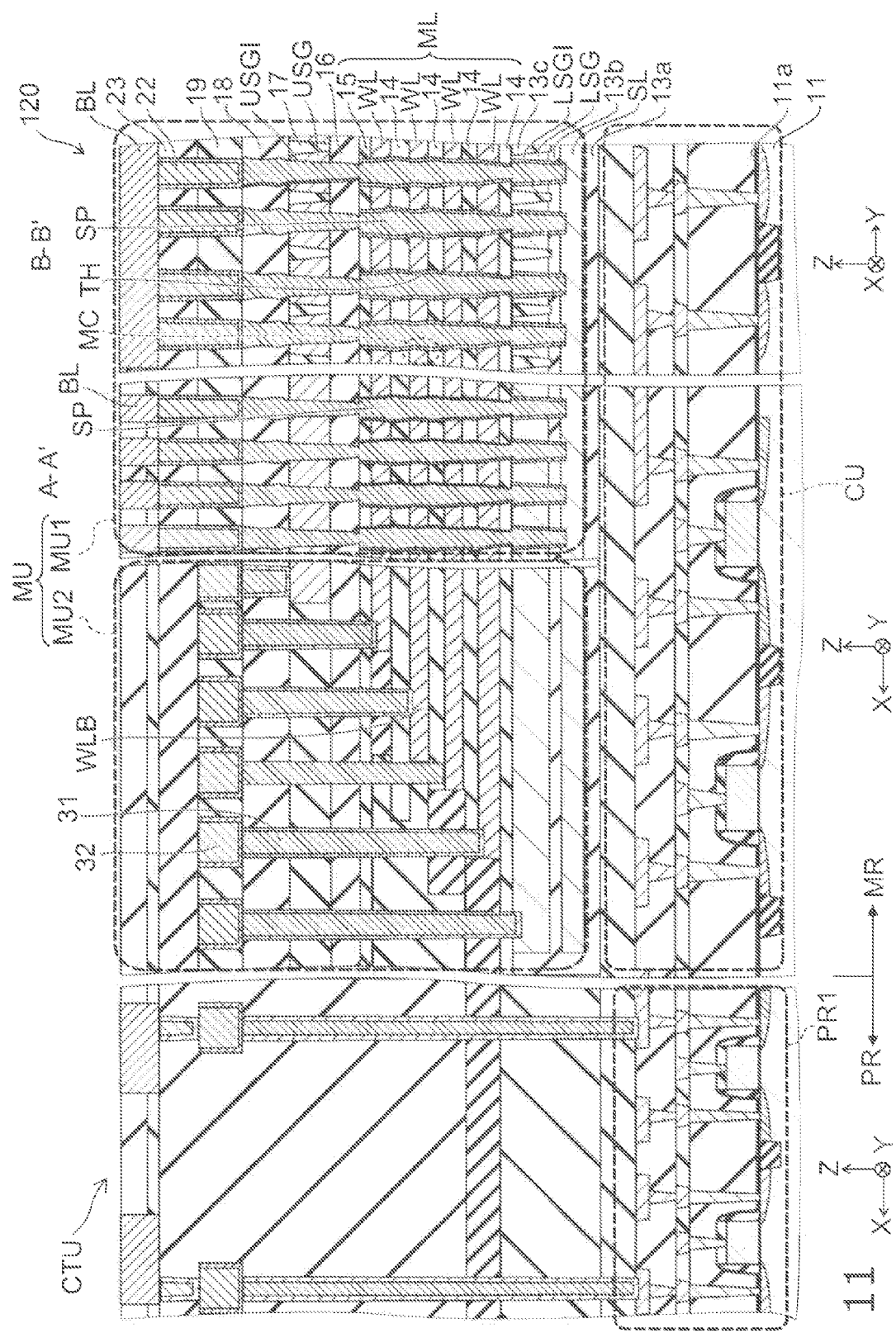
FIG. 11 is a schematic cross-sectional view illustrating the configuration of a nonvolatile semiconductor memory device according to a second embodiment.
Figure 12:
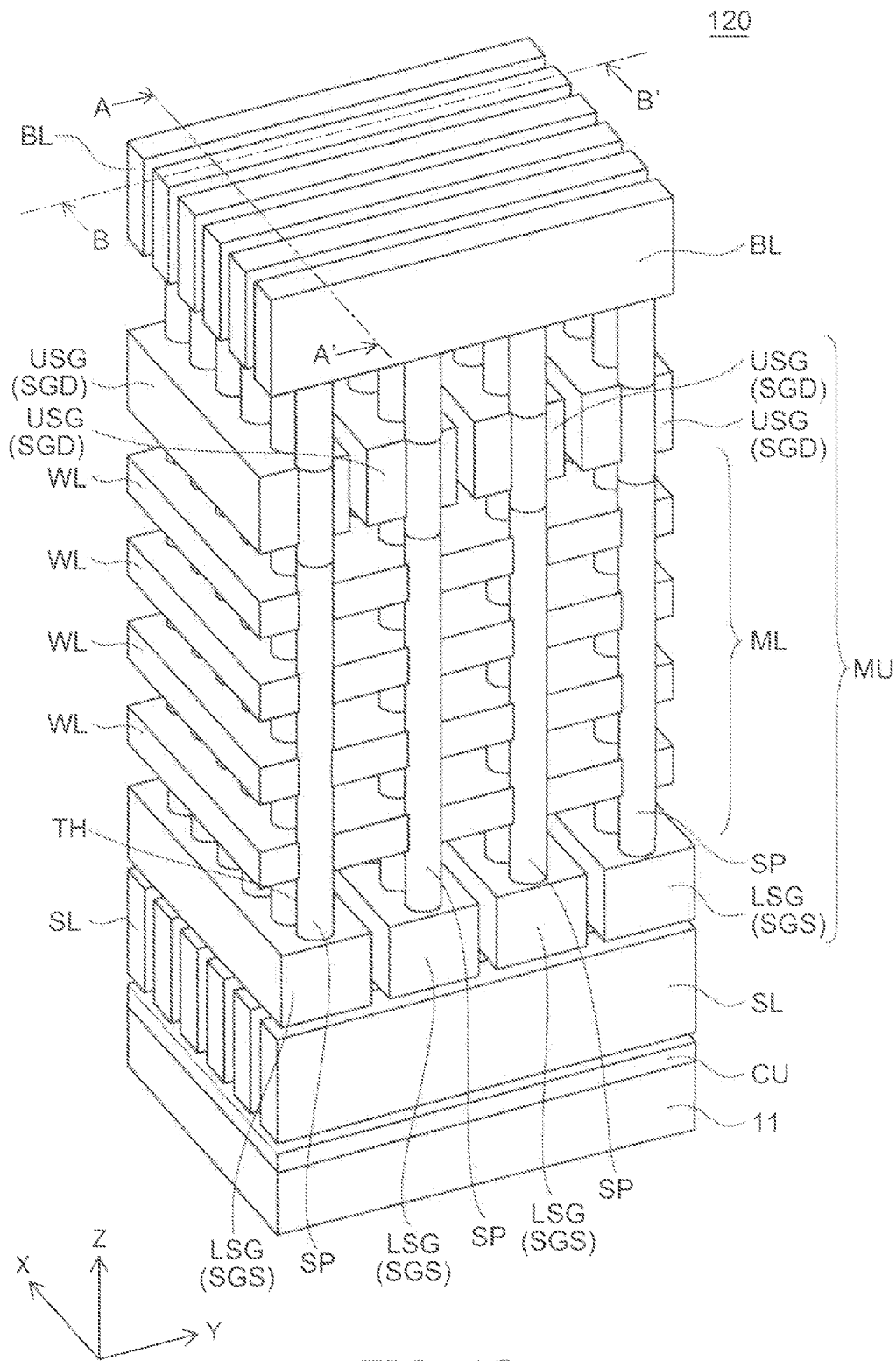
FIG. 12 is a schematic perspective view illustrating the configuration of the nonvolatile semiconductor memory device according to the second embodiment.

FIGS. 11 and 12 are a schematic cross-sectional view and a schematic perspective view, respectively, illustrating the configuration of a nonvolatile semiconductor memory device according to a second embodiment.

It is noted that for clarity of illustration, FIG. 12 shows only the conductive portions, and omits the insulating portions.

As shown in FIGS. 11 and 12, the nonvolatile semiconductor memory device 120 according to this embodiment also includes a memory unit MU and a control unit CTU.

In the memory unit MU, the semiconductor pillars SP are not connected in a U-shape, but are independent of each other. That is, the nonvolatile semiconductor memory device 120 includes linear memory strings. An upper selection gate electrode USG (illustratively serving as a drain side selection gate electrode SGD) is provided above the stacked structure ML, and a lower selection gate electrode LSG (illustratively serving as a source side selection gate electrode SGS) is provided below the stacked structure ML.

An upper selection gate insulating film USGI illustratively made of silicon oxide film is provided between the upper selection gate electrode USG and the semiconductor pillar SP, and a lower selection gate insulating film LSGI illustratively made of silicon oxide film is provided between the lower selection gate electrode LSG and the semiconductor pillar SP.

Furthermore, a source line SL is provided below the lower selection gate electrode LSG. An interlayer insulating film 13a is provided below the source line SL, and an interlayer insulating film 13b is provided between the source line SL and the lower selection gate electrode LSG.

The semiconductor pillar SP is connected to the source line SL below the lower selection gate electrode LSG, and to a bit line BL above the upper selection gate electrode USG. Thus, memory cells MC are formed in the stacked structure ML between the upper selection gate electrode USG and the lower selection gate electrode LSG, and the semiconductor pillar SP functions as one linear memory string.

The upper selection gate electrode USG and the lower selection gate electrode LSG are divided in the Y-axis direction by an interlayer insulating film 17 and an interlayer insulating film 13c, respectively, and shaped like strips extending in the X-axis direction.

On the other hand, the bit line BL connected to the upper portion of the semiconductor pillar SP and the source line SL connected to the lower portion of the semiconductor pillar SP are shaped like strips extending in the Y-axis direction.

In this case, the electrode film WL is a plate-like conductive film parallel to the X-Y plane.

Also in the nonvolatile semiconductor memory device 120 having such a structure, for instance, in the case where the through hole TH is tapered with the diameter varied, in the first region RG1 where the outer diameter of the outer insulating film 43 along the Y-axis direction perpendicular to the Z-axis direction is large, the thickness of the outer insulating film 43 along the Y-axis direction is designed to be thicker than that in the second region RG2 where the outer diameter is small. Thus, good operating characteristics can be achieved by compensating for the variation of electric field due to the variation in the diameter of the through hole TH.

In the nonvolatile semiconductor memory device according to the embodiments of the invention, the interelectrode insulating film 14, the inner insulating film 42, and the outer insulating film 43 can be a monolayer film made of a material selected from the group consisting of silicon oxide, silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

The memory layer 48 can be a monolayer film made of a material selected from the group consisting of silicon nitride, silicon oxynitride, aluminum oxide, aluminum oxynitride, hafnia, hafnium aluminate, hafnia nitride, hafnium nitride aluminate, hafnium silicate, hafnium nitride silicate, lanthanum oxide, and lanthanum aluminate, or a stacked film made of a plurality of materials selected from the group.

In this specification, "perpendicular" and "parallel" mean not only being exactly perpendicular and exactly parallel, but include, for instance, variations in the manufacturing process, and only need to mean substantially perpendicular and substantially parallel.

The embodiments of the invention have been described with reference to examples. However, the invention is not limited to these examples. For instance, various specific configurations of the components such as the substrate, electrode film, insulating film, insulating layer, stacked structure, memory layer, charge storage layer, semiconductor pillar, word line, bit line, source line, interconnection, memory cell transistor, and selection gate transistor constituting the nonvolatile semiconductor memory device are encompassed within the scope of the invention as long as those skilled in the art can similarly practice the invention and achieve similar effects by suitably selecting such configurations from conventionally known ones.

Furthermore, any two or more components of the examples can be combined with each other as long as technically feasible, and such combinations are also encompassed within the scope of the invention as long as they fall within the spirit of the invention.

Furthermore, those skilled in the art can suitably modify and implement the nonvolatile semiconductor memory device described above in the embodiments of the invention, and all the nonvolatile semiconductor memory devices thus modified are also encompassed within the scope of the invention as long as they fall within the spirit of the invention.

Furthermore, those skilled in the art can conceive various modifications and variations within the spirit of the invention, and it is understood that such modifications and variations are also encompassed within the scope of the invention. For instance, those skilled in the art can suitably modify the above embodiments by addition, deletion, or design change of components, or by addition, omission, or condition change of processes, and such modifications are also encompassed within the scope of the invention as long as they fall within the spirit of the invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the invention.

The invention claimed is:

1. A nonvolatile semiconductor memory device comprising:
   a stacked structure including a plurality of electrode films and a plurality of interelectrode insulating films alternately stacked in a first direction;
   a semiconductor pillar piercing the stacked structure in the first direction;
   a memory layer provided between each of the electrode films and the semiconductor pillar;
   an inner insulating film provided between the memory layer and the semiconductor pillar; and
   an outer insulating film provided between each of the electrode films and the memory layer,
   the device including a first region and a second region, the first region including a first electrode film being one of the electrode films, the second region including a second electrode film being an other of the electrode films, an outer diameter of the outer insulating film along a second direction perpendicular to the first direction in the first region being larger than an outer diameter of the outer insulating film along the second direction in the second region,
   a thickness of the outer insulating film along the second direction changing at a region between the first region and the second region, and
   a first thickness of the outer insulating film along the second direction in the first region being thicker than a second thickness of the outer insulating film along the second direction in the second region, the first thickness being a thickness in all of a region between the semiconductor pillar and the first electrode film, and the second thickness being a thickness in all of a region between the semiconductor pillar and the second electrode film located in the second region.

2. The device according to claim 1, further comprising:
   a substrate,
   the stacked structure being provided on a major surface of the substrate,
   the first direction being perpendicular to the major surface, and
   the first region being located farther from the substrate than the second region as viewed in the first direction.

3. The device according to claim 1, wherein an angle between an outer wall surface of the outer insulating film and the first direction is 0.8 degree or more.

4. The device according to claim 1, wherein an electric field at a surface of the inner insulating film on the semiconductor pillar side in the first region is equal to an electric field at the surface of the inner insulating film on the semiconductor pillar side in the second region.

5. The device according to claim 1, wherein
   a first semiconductor pillar thickness $t_{11}$ is defined as a distance along the second direction from the center of the semiconductor pillar in the second direction to a boundary between the semiconductor pillar and the inner insulating film in the first region,
   a first inner insulating film thickness $t_{12}$ is defined as a thickness of the inner insulating film along the second direction in the first region,
   a first memory layer thickness $t_{13}$ is defined as a thickness of the memory layer along the second direction in the first region,
   a first outer insulating film thickness $t_{14}$ is defined as the thickness of the outer insulating film along the second direction in the first region,
   a second semiconductor pillar thickness $t_{21}$ is defined as a distance along the second direction from the center of the semiconductor pillar in the second direction to the boundary between the semiconductor pillar and the inner insulating film in the second region,
   a second inner insulating film thickness $t_{22}$ is defined as a thickness of the inner insulating film along the second direction in the second region,
   a second memory layer thickness $t_{23}$ is defined as a thickness of the memory layer along the second direction in the second region,
   a second outer insulating film thickness $t_{24}$ is defined as the thickness of the outer insulating film along the second direction in the second region, and
   the first outer insulating film thickness $t_{14}$ and the second outer insulating film thickness $t_{24}$ satisfy following relation $$t_{11}\left(\frac{1}{\varepsilon_1}\ln\frac{t_{11}+t_{12}}{t_{11}} + \frac{1}{\varepsilon_2}\ln\frac{t_{11}+t_{12}+t_{13}}{t_{11}+t_{12}} + \frac{1}{\varepsilon_3}\ln\frac{t_{11}+t_{12}+t_{13}+t_{14}}{t_{11}+t_{12}+t_{13}}\right) = t_{21}\left(\frac{1}{\varepsilon_1}\ln\frac{t_{21}+t_{22}}{t_{21}} + \frac{1}{\varepsilon_2}\ln\frac{t_{21}+t_{22}+t_{23}}{t_{21}+t_{22}} + \frac{1}{\varepsilon_3}\ln\frac{t_{21}+t_{22}+t_{23}+t_{24}}{t_{21}+t_{22}+t_{23}}\right)$$

where
   $\varepsilon_1$ is relative permittivity of the inner insulating film,
   $\varepsilon_2$ is relative permittivity of the memory layer, and
   $\varepsilon_3$ is relative permittivity of the outer insulating film.

6. The device according to claim 1, wherein a thickness of the inner insulating film along the second direction in the first region is substantially equal to a thickness of the inner insulating film along the second direction in the second region.

7. The device according to claim 1, wherein a thickness of the memory layer along the second direction in the first region is substantially equal to a thickness of the memory layer along the second direction in the second region.

8. The device according to claim 1, wherein curvature of the inner insulating film in the first region is substantially equal to curvature of the inner insulating film in the second region.

9. The device according to claim 1, wherein relative permittivity of the inner insulating film is substantially equal to relative permittivity of the outer insulating film.

10. The device according to claim 1, wherein the inner insulating film and the outer insulating film include silicon oxide.

11. The device according to claim 1, wherein the memory layer includes silicon nitride.

12. The device according to claim 1, wherein the thickness of the outer insulating film along the second direction discontinuously varies along the first direction.

13. The device according to claim 1, wherein a shape of the inner insulating film, a shape of the memory layer, and a shape of the outer insulating film cut along a plane perpendicular to the first direction are circular.

14. The device according to claim 1, wherein the semiconductor pillar is provided in a plurality, a plurality of the semiconductor pillars include a first semiconductor pillar and a second semiconductor pillar adjacent to the first semiconductor pillar along the second direction, and one end of a first semiconductor pillar is electrically connected to one end of the second semiconductor pillar.

15. The device according to claim 1, wherein the electrode films include impurity-doped silicon.

16. The device according to claim 1, wherein the interelectrode insulating films include silicon oxide.

17. The device according to claim 1, wherein the thickness of the outer insulating film changes continuously at the region between the first region and the second region.

* * * * *